(12) United States Patent
Hashimoto et al.

(10) Patent No.: US 11,718,770 B2
(45) Date of Patent: Aug. 8, 2023

(54) CURABLE RESIN COMPOSITION AND CURABLE SHEET

(71) Applicant: NAGASE CHEMTEX CORPORATION, Osaka (JP)

(72) Inventors: Takayuki Hashimoto, Tatsuno (JP);
Eiichi Nomura, Tatsuno (JP); Katsushi Kan, Tatsuno (JP); Daisuke Mori, Tatsuno (JP); Yosuke Oi, Tatsuno (JP); Yukio Yada, Tatsuno (JP); Takashi Hiraoka, Tatsuno (JP); Takeyuki Kitagawa, Tatsuno (JP)

(73) Assignee: NAGASE CHEMTEX CORPORATION, Osaka (JP)

( * ) Notice: Subject to any disclaimer, the term of this patent is extended or adjusted under 35 U.S.C. 154(b) by 271 days.

(21) Appl. No.: 17/293,327

(22) PCT Filed: Jul. 12, 2019

(86) PCT No.: PCT/JP2019/027716
§ 371 (c)(1),
(2) Date: May 12, 2021

(87) PCT Pub. No.: WO2020/100345
PCT Pub. Date: May 22, 2020

(65) Prior Publication Data

US 2021/0403765 A1     Dec. 30, 2021

(30) Foreign Application Priority Data

Nov. 14, 2018 (JP) .................... 2018-214221

(51) Int. Cl.
*B32B 7/12* (2006.01)
*C09J 7/35* (2018.01)
(Continued)

(52) U.S. Cl.
CPC ................ *C09J 7/35* (2018.01); *B32B 9/005* (2013.01); *B32B 9/045* (2013.01); *B32B 27/20* (2013.01);
(Continued)

(58) Field of Classification Search
CPC ...................................... C09J 7/10; C09J 7/35
See application file for complete search history.

(56) References Cited

U.S. PATENT DOCUMENTS

2016/0362546 A1   12/2016   Hasegawa et al.
2020/0388509 A1*  12/2020   Nomura ................ H01L 21/568

FOREIGN PATENT DOCUMENTS

CN    106715581 A    5/2017
JP    2014-095063 A  5/2014
(Continued)

OTHER PUBLICATIONS

International Search Report for PCT/JP2019/027716 dated Oct. 8, 2019.
(Continued)

*Primary Examiner* — Elizabeth E Mulvaney
(74) *Attorney, Agent, or Firm* — Sughrue Mion, PLLC

(57) ABSTRACT

A curable resin composition includes: a first epoxy resin having a polyoxyalkylene chain; a second epoxy resin different from the first epoxy resin; a thermoplastic resin having a weight average molecular weight of 300,000 or less, and having a reactive functional group; at least one selected from the group consisting of a curing agent and a curing accelerator; and an inorganic filler.

21 Claims, 3 Drawing Sheets

(51) Int. Cl.

| | | |
|---|---|---|
| *C09J 7/10* | (2018.01) | |
| *B32B 9/00* | (2006.01) | |
| *B32B 9/04* | (2006.01) | |
| *B32B 27/20* | (2006.01) | |
| *B32B 27/28* | (2006.01) | |
| *B32B 27/30* | (2006.01) | |
| *B32B 27/36* | (2006.01) | |
| *B32B 27/38* | (2006.01) | |
| *C09J 11/04* | (2006.01) | |
| *H01L 23/29* | (2006.01) | |

(52) U.S. Cl.
CPC .......... *B32B 27/283* (2013.01); *B32B 27/308* (2013.01); *B32B 27/36* (2013.01); *B32B 27/38* (2013.01); *C09J 7/10* (2018.01); *C09J 11/04* (2013.01); *H01L 23/295* (2013.01); *B32B 2264/1021* (2020.08); *B32B 2270/00* (2013.01); *B32B 2457/14* (2013.01); *C09J 2203/326* (2013.01); *C09J 2433/00* (2013.01); *C09J 2463/00* (2013.01); *C09J 2467/00* (2013.01); *C09J 2483/00* (2013.01)

(56) References Cited

FOREIGN PATENT DOCUMENTS

| | | | |
|---|---|---|---|
| JP | 2014-185271 A | 10/2014 | |
| JP | 2016-175972 A | 10/2016 | |
| JP | 2017-002203 A | 1/2017 | |
| WO | WO-2014126147 A1 * | 8/2014 | .............. C09J 11/04 |
| WO | 2015/146149 A1 | 10/2015 | |
| WO | 2016/125350 A1 | 8/2016 | |
| WO | 2017/030126 A1 | 2/2017 | |
| WO | WO-2017030754 A1 * | 2/2017 | ........... C08G 59/066 |

OTHER PUBLICATIONS

Chinese Office Action dated Feb. 21, 2023 in Chinese Application No. 201980075204.2.

* cited by examiner

US 11,718,770 B2

CURABLE RESIN COMPOSITION AND CURABLE SHEET

CROSS REFERENCE TO RELATED APPLICATIONS

This application is a National Stage of International Application No. PCT/JP2019/027716 filed Jul. 12, 2019, claiming priority based on Japanese Patent Application No. 2018-214221 filed Nov. 14, 2018.

TECHNICAL FIELD

The present invention relates to a curable resin composition for forming a cured product through curing by the action of heat or the like, and a curable sheet formed from the curable resin composition.

BACKGROUND ART

With growing demand for smaller and thinner semiconductor products in recent years, attention has been drawn to a packaging technology known as wafer level package (WLP) technology. When sealing such a substrate including a circuit member (sometimes referred to as a circuit board), in some cases, a sealing material in the form of sheet, particles, liquid, or the like is used. The sealing material used is, for example, a curable resin composition that is curable by the action of heat or the like. For example, Patent Literature 1 discloses a sealing sheet formed using a thermosetting composition containing an epoxy resin.

CITATION LIST

Patent Literature

[PTL 1] Japanese Laid-Open Patent Publication No. 2016-175972

SUMMARY OF INVENTION

Technical Problem

For example, when a substrate, such as a circuit board, is sealed with a sealing sheet, the sheet is brought into close contact with the substrate and then cured. Since a cured product of the sealing material and the substrate have different linear expansion coefficients, warpage tends to occur in a laminate of the cured product and the substrate. The cured product is required to have a certain degree of strength. However, when the strength of the cured product is increased, the elasticity is also increased, causing a severer warpage in the laminate. The suppression of warpage and the securement of strength are in a trade-off relationship and have been difficult to be satisfied at the same time.

Solution to Problem

One aspect of the present invention relates to a curable resin composition, including: a first epoxy resin having a polyoxyalkylene chain; a second epoxy resin different from the first epoxy resin; a thermoplastic resin having a weight average molecular weight of 300,000 or less, and having a reactive functional group; at least one selected from the group consisting of a curing agent and a curing accelerator; and an inorganic filler.

Another aspect of the present invention relates to a curable sheet formed from the aforementioned curable resin composition.

Advantageous Effects of Invention

According to the above aspects of the present invention, it is possible to provide: a curable resin composition that, while ensuring a certain strength of a cured product thereof, can suppress the warpage of a laminate of a layer of the cured product and a substrate; and a curable sheet formed therefrom.

While the novel features of the invention are set forth particularly in the appended claims, the invention, both as to organization and content, will be better understood and appreciated, along with other objects and features thereof, from the following detailed description taken in conjunction with the drawings.

DESCRIPTION OF EMBODIMENTS

Figure 1:
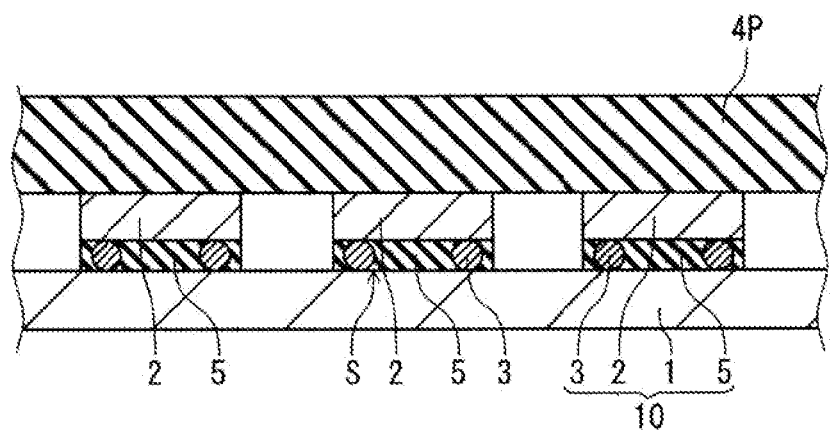
FIG. 1 A schematic cross-sectional view for explaining a step of placing a curable sheet on a mounting member, in the process of sealing a mounting structure (mounting member) including a substrate, using a curable sheet according to an embodiment of the present invention.

A curable resin composition according to one aspect of the present invention includes: a first epoxy resin having a polyoxyalkylene chain; a second epoxy resin different from the first epoxy resin; a thermoplastic resin having a weight average molecular weight of 300,000 or less, and having a reactive functional group; at least one selected from the group consisting of a curing agent and a curing accelerator; and an inorganic filler.

In the case of sealing a substrate (e.g., circuit board) with a curable resin composition, due to the difference in linear expansion coefficient between the curable resin composition and the substrate, warpage tends to occur, during curing of the curable resin composition, in a laminate of the curable resin composition and the substrate. Especially when sealing a large-size substrate, a severe warpage occurs. Warpage, if any, will cause some inconvenience in the later steps, such as grinding and dicing steps, and therefore, the prevention of warpage has been an important technical issue to be solved. For example, when a sheet constituted of a curable resin composition is used for sealing a substrate, such as a circuit board, the substrate is sealed by placing the sheet in close contact with the substrate, followed by curing. In the case of a sheet, warpage tends to occur, in particular, in a laminate of the sheet and the substrate. Furthermore, for the curable resin composition and the sheet, a certain degree of strength is required when placing it in contact with the substrate and when after it is cured. However, when the strength of the sheet and the cured product is increased, the elasticity is also increased, which results in a severer warpage in the laminate. Also, the warpage, once it occurs, is difficult to be relaxed. Even though a material excellent in strength and a material with low elasticity are mixed, these conflicting characteristics are difficult to achieve at the same time.

According to the above aspect of the present invention, by using the first epoxy resin and the second epoxy resin, excellent strength and low elasticity (or flexibility) of a cured product can be achieved at the same time. Moreover, in addition to using the first epoxy resin, since the thermoplastic resin is allowed to be co-present in a dispersed state in the vicinity of the first and second epoxy resins, the flexibility of the cured product can be enhanced, and excellent stress relaxation property can be ensured. Therefore, it is thought that warpage occurring in a laminate of the cured product and the substrate immediately after the curing of the cured product can be reduced. In addition, since the stress can be relaxed, even when warpage once occurs, the warpage can be relaxed by allowing the laminate to stand for a while.

The substrate as used herein means a substrate including an electronic component, an assembly of electronic components, or an electronic component itself.

One aspect of the present invention encompasses a curable sheet formed from the curable resin composition. When the curable sheet is used, excellent strength of a cured product can be ensued, and at the same time, even when laminated with a member having a different linear expansion coefficient, such as the substrate, warpage occurring in the laminate can be reduced. Moreover, the warpage occurred can be relaxed.

A detailed description will be given below of the curable resin composition and the curable sheet.

(Curable Resin Composition)

The curable resin composition includes a first epoxy resin, a second epoxy resin, the aforementioned thermoplastic resin, a curing agent and/or a curing accelerator, and an inorganic filler. Herein, the first epoxy resin, the second epoxy resin, and the aforementioned thermoplastic resin (in the case of using one or more other resins, including these resins) are sometimes collectively referred to as a curable resin. The curable resin according to the above aspect is a thermosetting resin composition including a curable resin that is cured through heating.

The curable resin composition may be liquid, sheet, or granular, and may be in a semi-cured state (so-called B stage).

(First Epoxy Resin)

The first epoxy resin has a polyoxyalkylene chain. By using the first epoxy resin and the second epoxy resin, while a certain degree of strength can be ensured by the second epoxy resin, flexibility can be secured by the first epoxy resin, and stress can be relaxed. The first epoxy resin may have a polyoxyalkylene chain at its side chain, but preferably at its main chain. When the first epoxy resin having a polyoxyalkylene chain at its main chain is used, high flexibility can be easily ensured, and stress relaxation property can be further enhanced.

An alkylene group contained in the polyoxyalkylene chain has, for example, two or more carbon atoms, preferably three or more carbon atoms, more preferably four or more carbon atoms. In view of forming a favorable phase-separated state between the first epoxy resin and the second epoxy resin more easily, the alkylene group preferably has four or more carbon atoms. In view of ensuring higher flexibility easily, the alkylene group preferably has 16 or less carbon atoms, and may have ten or less, or six or less carbon atoms. These lower limit and upper limit values can be combined in any combination.

The alkylene group may have, for example, two to 16, two to ten, two to six, three to 16, three to ten, three to six, four to 16, four to ten, or four to six carbon atoms.

Specific examples of the alkylene group include ethylene, propylene, trimethylene, butylene (e.g., 1,2-butylene, 1,3-butylene, 1,4-butylene (or tetramethylene)), hexamethylene, octamethylene, and decamethylene.

The alkylene group may have a straight-chain or branched-chain structure, but in view of ensuring high flexibility easily, it preferably has a straight-chain structure.

The number n of repeating oxyalkylene units in the polyoxyalkylene chain is, for example, three or more, preferably four or more, or five or more, may be six or more, or seven or more, and may be eight or more. When the number n is in such a range, flexibility can be easily enhanced, while a favorable phase-separated state between the first epoxy resin and the second epoxy resin can be secured. Therefore, the stress relaxation effect can be further enhanced. In view of easily dispersing the first epoxy resin and achieving excellent stress relaxation effect, the number n of repeating oxyalkylene units is, for example, 200 or less, preferably 100 or less, and may be 70 or less, or 30 or less. These lower limit and upper limit values can be combined in any combination.

The number n of repeating oxyalkylene units may be, for example, three to 200, three to 100, three to 70, three to 30, four to 70, four to 30, five to 70, five to 30, six to 70, six to 30, seven to 70, or seven to 30.

The polyoxyalkylene chain may have one kind of oxyalkylene unit and may have a plurality of oxyalkylene units of different kinds. When the first epoxy resin has a plurality of oxyalkylene units of different kinds, the sum of the number of oxyalkylene units of each kind satisfies the above number n of repeating units. For example, when the first epoxy resin has one chain comprising one oxyethylene unit, one oxytetramethylene unit, one oxypropylene unit, and one oxytetramethylene unit bonded together in this order, the number n of repeating oxyalkylene units is four. When the first epoxy resin has a plurality of polyoxyalkylene chains not directly linked to each other, and when the first epoxy resin has a plurality of polyoxyalkylene chains different in kinds of oxyalkylene units, the sum of the number of repeating oxyalkylene units in each polyoxyalkylene chain preferably satisfies the above number n of repeating units. When the first epoxy resin has a plurality of oxyalkylene units of different kinds, it may be of a random type in which different kinds of oxyalkylene units are randomly arranged in the polyoxyalkylene chain, or of a block type in which a plurality of blocks of different kinds of polyoxyalkylene chains are linked together.

The first epoxy resin may be of any kind that has a polyoxyalkylene chain, and may be of a glycidyl ether type, a glycidyl ester type, a glycidyl amine type, an alicyclic epoxy compound, or the like. In view of the ease of availability, a glycidyl ether having a polyoxyalkylene chain (specifically, a polyalkylene glycol glycidyl ether) or the like is used.

Examples of the glycidyl ether-type first epoxy resin include polyethylene glycol diglycidyl ether, polypropylene glycol diglycidyl ether, polytrimethylene glycol diglycidyl ether, polybutylene glycol diglycidyl ether, polyhexamethylene glycol diglycidyl ether, and polyethylene glycol-polypropylene glycol diglycidyl ether.

A glycidyl ether of an alkylene oxide adduct of a polyol may be also used as the glycidyl ether-type first epoxy resin. The moiety of added alkylene oxide units corresponds to the above polyoxyalkylene chain. The polyol may be an aromatic polyol, an alicyclic polyol, and the like. Examples of the aromatic polyol include bisphenols (e.g., bisphenol A, bisphenol F, bisphenol S). Examples of the alicyclic polyol include a hydride of an aromatic polyol.

The first epoxy resin may be used singly or in combination of two or more kinds.

The epoxy equivalent of the first epoxy resin may be, for example, 200 g/eq or more and 800 g/eq or less. When the epoxy equivalent is within the range as above, the phase-separated state from the second epoxy resin is likely to be formed, and favorable stress relaxation property can be achieved.

A Hansen solubility parameter (HSP) value of the first epoxy resin and a HSP value of the second epoxy resin differ by, for example, 6 or more, may be 7 or more, and is preferably 9 or 10 or more, more preferably 11 or more. When the difference of the HSP value is within the range above, a favorable phase-separated state can be easily formed in the curable resin composition, and more excellent stress relaxation effect can be obtained. In view of maintaining the moderate phase-separated state easily, the difference of the HSP value between these resins is, for example, 15 or less.

The HSP expresses the solubility of a substance by three parameters: a dispersion term $\delta D$, a polar term $\delta P$, and a hydrogen bonding term $\delta H$. The dispersion term $\delta D$, the polar term $\delta P$, and the hydrogen bonding term $\delta H$ are values of physical properties intrinsic to the substance, and are written in a document, for example, "Hansen Solubility Parameters: A User's Handbook, HSPiP 3rd Edition ver. 3.0.20." For the hydrogen bonding term $\delta H$, the values written in the above document can be used. When not written, an estimation method using a neural network method called the Y-MB method can be used to calculate the hydrogen bonding term $\delta H$.

(Second Epoxy Resin)

The second epoxy resin is an epoxy resin different from the first epoxy resin. For example, an epoxy resin having no polyoxyalkylene chain may be used as the second epoxy resin. The second epoxy resin may be liquid, solid, semi-solid, or other states at 25° C. The second epoxy resin may be used singly or in combination of two or more kinds.

(Epoxy Resin 2A)

The second epoxy resin preferably includes, for example, an epoxy resin (referred to as epoxy resin 2A) having a glass transition point (Tg) of 50° C. or higher. When such an epoxy resin 2A is used, the strength of a cured product of the curable resin composition can be further increased. The Tg of the epoxy resin 2A is preferably 50° C. or higher, and may be 100° C. or higher. When the Tg is in the range as above, high strength can be easily imparted to the cured product. In view of easily taking a balance of the phase separation structure with the first epoxy resin, the Tg of the epoxy resin 2A is, for example, 230° C. or lower.

The Tg of the epoxy resin 2A means a Tg of a cured product of the epoxy resin 2A. The Tg of the cured product of the epoxy resin 2A can be measured using a sample produced by forming a 2-mm-thick film using a mixture containing the epoxy resin 2A and a phenol novolac-type resin serving as a curing agent in equal amounts, and curing the film at 175° C. for 3 hours. Using this sample, the loss tangent tan $\delta$ is measured by dynamic viscoelasticity analysis (DMA) using a commercially available dynamic viscoelasticity meter, at a frequency of 1 Hz, at varied temperatures, and a temperature at which the tan $\delta$ reaches a peak (top peak) is determined as the Tg.

The epoxy resin 2A may be of any kind. In view of securing curability easily, it is preferable to use at least an epoxy resin having two or more epoxy groups. In view of forming a favorable phase separation structure easily, preferred is a polyfunctional epoxy resin in which the average number of epoxy functional groups per one molecule is greater than two. The polyfunctional epoxy resin in which the average number of epoxy functional groups per one molecule is greater than two encompasses, for example, a trifunctional or higher polyfunctional epoxy resin, and a material in which a trifunctional or higher polyfunctional epoxy resin and a less than trifunctional epoxy resin (e.g., a monofunctional epoxy resin having one epoxy group and/or a bifunctional epoxy resin) are present together. Optionally, a monofunctional epoxy resin may be used singly, or in combination with one or more other epoxy resins.

Examples of the epoxy resin 2A include: a bisphenol-type epoxy resin (e.g., bisphenol A-type epoxy resin, bisphenol F-type epoxy resin, bisphenol AD-type epoxy resin, bisphenol S-type epoxy resin); an oligomer mixture in which a bisphenol-type epoxy resin is partially condensed; a biphenyl-type epoxy resin (e.g., a biphenyl-type epoxy resin having a substituent (e.g., an alkyl group, for example, a $C_{1-4}$ alkyl group, such as methyl or butyl) in its biphenyl ring, such as 3,3',5,5'-tetramethyl-4,4'bis(glycidyloxy)-1,1'-biphenyl, 3,3'5,5'-tetratert-butyl-4,4'-bis(glycidyloxy)-1,1'-biphenyl, 4,4'-bis(glycidyloxy)biphenyl, or 3,3'-dimethyl-4,4'-bis(glycidyloxy)biphenyl); a novolac-type epoxy resin (e.g., phenol novolac-type epoxy resin, triphenylmethane novolac-type epoxy resin); a fluorene-type epoxy resin (e.g., bisphenol fluorene-type epoxy resin, biscresol fluorene-type epoxy resin); a naphthalene-type epoxy resin (e.g., 1,6-bis(2,3-epoxypropoxy)naphthalene); a phenolic epoxy resin (e.g., catechol diglycidyl ether, resorcinol diglycidyl ether); a ketonic aromatic epoxy resin (e.g., 2,4-bis(glycidyloxy) benzophenone, 4,4'-bis(glycidyloxy)benzophenone), a hydrogenated product of the above (e.g., hydrogenated bisphenol A-type epoxy resin, hydrogenated bisphenol F-type epoxy resin, hydrogenated bisphenol S-type epoxy resin); a quinone-type epoxy resin (e.g., 2,5-diisopropyl hydroquinone diglycidyl ether, hydroquinone diglycidyl ether); a cycloaliphatic epoxy resin (e.g., diepoxylimonene); a dicyclopentadiene-type epoxy resin; a glycidyl ester-type epoxy resin; glycidyl amine-type epoxy resin; a glycoluril-type epoxy resin (e.g., an epoxy resin having a glycoluril skeleton); and a phenol phthalein-type epoxy resin. The epoxy resin 2A may be a prepolymer, and may be a copolymer of an epoxy resin and another polymer, such as polyether-modified or silicone-modified epoxy resin. The epoxy resin 2A may be used singly or in combination of two or more kinds.

Examples of the glycidyl ester-type epoxy resin include glycidyl esters of organic carboxylic acids (e.g., a glycidyl ester of an aromatic polycarboxylic acid, such as phthalic acid diglycidyl ester). Examples of the glycidyl amine-type epoxy resin include an amino phenolic epoxy resin (e.g., p-aminophenol-type epoxy resin, such as triglycidyl-p-aminophenol), an aniline-type epoxy resin (e.g., diglycidylaniline, 4,4'-methylenebis[N,N-bis(oxiranylmethyl)aniline], toluidine-type epoxy resin (e.g., diglycidylorthotoluidine), diaminodiphenylmethane-type epoxy resin (e.g., tetraglycidyl diaminodiphenylmethane), and a nitrogen-containing heterocyclic epoxy resin (e.g., isocyanuric acid triglycidyl).

In view of ensuring the strength easily, as the epoxy resin 2A, an epoxy resin containing at least one kind of ring structure selected from the group consisting of an aromatic ring and a five- or more-membered heterocyclic ring, or a hydride thereof is preferably used. In view of forming of the phase separation structure easily, a bisphenol-type epoxy resin (e.g., bisphenol S-type epoxy resin), and a glycidyl amine of a nitrogen-containing heterocyclic ring are preferred. A glycidyl amine-type epoxy resin and a bisphenol-type epoxy resin may be used in combination. In this case, adhesion to an adherend (e.g., substrate) can be enhanced. A bisphenol-type epoxy resin (e.g., bisphenol A-type epoxy resin, bisphenol F-type epoxy resin) is preferred in terms of its excellent heat resistance and water resistance, and being inexpensive and economical. In terms of moisture resistance, a naphthalene-type epoxy resin is preferred.

The epoxy equivalent of the epoxy resin 2A is preferably, for example, 50 g/eq or more and 500 g/eq or less. When the epoxy equivalent is within the range above, high strength tends to be obtained, and the Tg can be easily adjusted.

(Epoxy Resin 2B)

The second epoxy resin can optionally contain an epoxy resin (epoxy resin 2B) other than the epoxy resin 2A. The epoxy resin 2B is not specifically limited, and may be polyfunctional or monofunctional. The epoxy resin 2B also may be of any type, and may be any one selected from a glycidyl ether-type epoxy resin, a glycidyl ester-type epoxy resin, a glycidyl amine-type epoxy resin, and an alicyclic epoxy resin. The epoxy resin 2B may be used singly or in combination of two or more kinds.

In view of adjusting the viscosity of the curable resin composition, a monofunctional epoxy resin may be used in combination. Examples of the monofunctional epoxy resin include phenylglycidyl ether, 2-ethylhexyl glycidyl ether, dicyclopentadienyl glycidyl ether, and 2-hydroxyethyl glycidyl ether.

The first epoxy resin and the second epoxy resin are contained in a mass ratio of, for example, 5:95 to 70:30, and may be contained in a mass ratio of 5:95 to 50:50, and in a mass ratio of 10:90 to 40:60, or 10:90 to 30:70. When the mass ratio of the first epoxy resin to the second epoxy resin is in the range as above, the strength and the flexibility tend to be obtained in a balanced manner.

The sum of the proportions of the first epoxy resin and the epoxy resin 2A in the whole epoxy resin contained in the curable resin composition is, for example, 90 mass % or more, and may be 95 mass % or more. The epoxy resin contained in the curable resin composition may be constituted only of the first epoxy resin and the epoxy resin 2A. When the proportions of the first epoxy resin and the epoxy resin 2A are high as above, the stress relaxation effect produced by the formation of a favorable phase-separated state can be more easily ensured.

(Thermoplastic Resin)

For the thermoplastic resin (first thermoplastic resin), various thermoplastic resins that have a weight average molecular weight (Mw) of 300,000 or less and has a reactive functional group may be used.

The weight average molecular weight (Mw) of the thermoplastic resin is 300,000 or less, and is preferably 200,000 or less, more preferably 150,000 or less or 100,000 or less. When the Mw of the thermoplastic resin is in the range as above, the dispersibility of the thermoplastic resin is increased, and excellent stress relaxation property can be more easily obtained. The Mw is preferably 5,000 or more. When the Mw of the thermoplastic resin is in the range as above, the elasticity of a cured product tends to be reduced, and the effect of suppressing warpage can be further enhanced.

The weight average molecular weight Mw is a weight average molecular weight based on polystyrene, as measured using gel permeation chromatography (GPC) in the specification.

The Mw of the thermoplastic resin can be determined, for example, by the following procedures.

The thermoplastic resin is dissolved in a solvent, to prepare a measurement sample. The solvent is selected from liquid mediums capable of dissolving the thermoplastic resin, according to the kind of the thermoplastic resin. The measurement sample is subjected to GPC under the conditions below, to determine its Mw.

Device: SYSTEM-21H, manufactured by Shodex Co., Ltd.
Detector: RI detector
Mobile phase: Tetrahydrofuran
Flow rate: 1 mL/min
Column: KD-806M (×3 columns), manufactured by Shodex Co., Ltd.
Column temperature: 40° C.
Reference material: Standard polystyrene (Mw=3900000, 650000, 65000, 5780, 589)

The Mw is usually measured with respect to the thermoplastic resin, raw material, to be used in the curable resin composition. However, when the raw material is not easily available, the thermoplastic resin separated from the curable resin composition by a known separation and purification method may be used to measure its Mw.

Examples of the reactive functional group that the thermoplastic resin has include an epoxy group, a carboxy group, a hydroxy group, an amino group (including an imino group), an amide group, a nitrile group, and a group having a polymerizable carbon-carbon unsaturated bond (e.g., vinyl group, allyl group, acryloyl group, methacryloyl group). The thermoplastic resin may have one kind or two or more kinds of these reactive functional groups. The thermoplastic resin preferably has, as the reactive functional group, at least an epoxy group. In this case, moderate affinity for the first epoxy resin and the second epoxy resin can be ensured. This can increase the dispersibility of the thermoplastic resin, and further enhance the stress relaxation property. The thermoplastic resin may be a monofunctional polymer having one reactive functional group in its molecule, and may be a polyfunctional polymer having two or more reactive functional groups in its molecule.

The thermoplastic resin may exhibit any form at 25° C., and thermoplastic resins that exhibit various forms, such as a form of solid (e.g., rubbery or pellet-like form) or liquid, at 25° C. may be used. In view of securing higher flexibility easily, a polymer material (including rubber) having elasticity like rubber at 25° C. may be used as the thermoplastic resin. The Tg of the thermoplastic resin is preferably 40° C. or lower, and 25° C. or lower. The Tg of the thermoplastic resin can be measured similarly to that of the epoxy resin 2A.

Examples of the thermoplastic resin include a diene-series thermoplastic resin (e.g., an isoprene rubber, a butadiene rubber, a styrene-butadiene rubber, a chloroprene rubber), an acrylic thermoplastic resin (e.g., an acrylic rubber), a nitrile-series thermoplastic resin (e.g., a nitrile rubber), an urethane-series thermoplastic resin (e.g., a urethane rubber), a silicone-based thermoplastic resin (e.g., a silicone rubber, a epoxy-modified silicone), a polyester-series thermoplastic resin (e.g., a crystalline polyester, an amorphous polyester, a polyester elastomer), a polyamide-based thermoplastic resin (e.g., a polyether ester amide, a polyamide elastomer), a butyl rubber, and an ethylene propylene rubber. The silicone-based thermoplastic resin may be solid or liquid at room temperature (e.g., 20 to 35° C.). Silicone oil is also encompassed in the silicone-based thermoplastic resin. It is to be noted, however, these thermoplastic resins are mere examples, and should not be taken as limitation.

The thermoplastic resin may be used singly or in combination of two or more kinds. When using two or more kinds of thermoplastic resins in combination, the two or more kinds of thermoplastic resins may differ in the number of reactive functional groups, the kinds of reactive functional groups, and/or the category (e.g., diene-series, acrylic).

In view of controlling the molecular weight and the molecular weight distribution easily, and in terms of the ease of introduction of the reactive functional group and its dispersibility in the curable resin composition, an acrylic thermoplastic resin may be used. In particular, an acrylic thermoplastic resin can be advantageously used for a sheet form of the curable resin composition. An acrylic thermoplastic resin may be used in combination with one or more other thermoplastic resins (e.g., nitrile-series thermoplastic resin, silicone-based thermoplastic resin, and/or dienes-series thermoplastic resin).

The acrylic thermoplastic resin (e.g., acrylic rubber) includes a thermoplastic resin containing a monomer unit (first monomer unit) having a reactive functional group and a (meth)acrylate unit (second monomer unit) or the like. The acrylic thermoplastic resin can optionally contain a third monomer unit other than these monomer units. The acrylate (or acrylic acid ester) and the methacrylate (or methacrylic acid ester) are sometimes collectively referred to as a (meth)acrylate.

Examples of the (meth)acrylate unit include an alkyl (meth)acrylate unit. The alkyl (meth)acrylate unit is exemplified by a $C_{1-6}$ alkyl (meth)acrylate unit (e.g., ethyl (meth) acrylate unit, propyl (meth)acrylate unit, butyl (meth)acrylate unit), and may be a $C_{1-4}$ alkyl (meth) acrylate unit. The acrylic polymer may contain one kind or two or more kinds of the second monomer units.

The first monomer unit includes a unit corresponding to a monomer having a reactive functional group and a polymerizable carbon-carbon unsaturated bond (e.g., vinyl group, allyl group, acryloyl group, methacryloyl group). When the reactive functional group has a polymerizable carbon-carbon unsaturated bond, a polyfunctional monomer is used so that the unreacted reactive functional group remains in the thermoplastic resin after the monomer is introduced into the thermoplastic resin. In terms of the polymerizability with the second monomer unit, the first monomer unit is preferably a monomer unit corresponding to an acrylic monomer having an acryloyl group and/or a methacryloyl group. The acrylic monomer unit having an epoxy group as the reactive functional group is, for example, a glycidyl (meth)acrylate unit. An acrylic polymer may contain one kind or two or more kinds of the first monomer units.

Examples of the third monomer unit include, but not limited to, a vinyl cyanide unit (e.g., acrylonitrile unit), a vinyl ether unit (e.g., 2-chloroethyl vinyl ether unit), and an olefin unit (e.g., ethylene unit). The acrylic polymer may contain one kind or two or more kinds of the third monomer units.

Also, a silicone-based thermoplastic resin is preferably used. Especially for a liquid curable resin composition, a silicone-based thermoplastic resin is advantageously used.

The thermoplastic resin is contained in an amount of, for example, 5 parts by mass or more, preferably 10 parts by mass or more, or 50 parts by mass or more, and may be 100 parts by mass or more, per 100 parts by mass of the total amount of the first epoxy resin and the second epoxy resin. When the amount of the thermoplastic resin is in the range as above, the elasticity of a cured product tends to be reduced, and the warpage is more likely to be relaxed. The amount of the thermoplastic resin is, for example, 400 parts by mass or less, and may be 300 parts by mass or less. In this case, the strength of a cured product is more likely to be ensured. These lower limit and upper limit values can be combined in any combination. In a sheet form of the curable resin composition, the amount of the thermoplastic resin is preferably 50 parts by mass or more. In a liquid form of the curable resin composition, the amount of the thermoplastic resin may be 150 parts by mass or less, may be 100 parts by mass or less, and may be 50 parts by mass or less, or 40 parts by mass or less.

The thermoplastic resin is contained in an amount of, per 100 parts by mass of the total amount of the first epoxy resin and the second epoxy resin, for example, 5 parts by mass or more and 400 parts by mass or less (or 300 parts by mass or less), 10 parts by mass or more and 400 parts by mass or less (or 300 parts by mass or less), 50 parts by mass or more and 400 parts by mass or less (or 300 parts by mass or less), 10 parts by mass or more and 400 parts by mass or less (or 300 parts by mass or less), 5 parts by mass or more and 150 parts by mass or less (or 100 parts by mass or less), 10 parts by mass or more and 150 parts by mass or less (or 100 parts by mass or less), 50 parts by mass or more and 150 parts by mass or less (or 100 parts by mass or less), 5 parts by mass or more and 50 parts by mass or less (or 40 parts by mass or less), or 10 parts by mass or more and 50 parts by mass or less (or 40 parts by mass or less)

(Curing Agent and Curing Accelerator)

The curable resin composition contains a curing agent and/or a curing accelerator. The curing agent is capable of curing the epoxy resin and/or reacting the thermoplastic resin. The curing accelerator facilitates the curing of the epoxy resin and/or the reaction of the thermoplastic resin. When the curing agent and the curing accelerator are each solid at 25° C., they each preferably have a melting point of, for example, 30 to 130° C.

As the curing agent, there may be used, for example, an acid anhydride, a phenol resin, or an amine compound.

Examples of the acid anhydride include, but not limited to, phthalic anhydride, hexahydrophthalic anhydride, alkylhexahydrophthalic anhydrides (e.g., methylhexahydrophthalic anhydride), tetrahydrophthalic anhydride, alkyltetrahydrophthalic anhydrides (e.g., 3-methyltetrahydrophthalic anhydride), trialkyltetrahydrophthalic anhydrides, himic anhydride, succinic anhydride, methylnadic anhydride, trimellitic anhydride, pyromellitic anhydride, and methylnorbornane-2,3-dicarboxylic acid. These may be used singly or in combination of two or more kinds.

The phenol resin (phenolic curing agent) is, although not specifically limited, preferably a phenol novolac resin. Phenol novolac resins are condensed polymers of phenols or naphthols (e.g., phenol, cresol, naphthol, alkylphenol, bisphenol, terpene phenol) and formaldehyde. Specific examples thereof include phenol novolac resin, alkyl phenol novolac resin (e.g., cresol novolac resin, butyl phenol novolac), biphenyl phenol novolac resin, terpene phenol novolac resin, α-naphthol novolac resin, β-naphthol novolac resin, dicyclopentadiene cresol, polyparavinylphenol, bisphenol A-type novolac, xylylene-modified novolac, decalin-modified novolac, poly(di-o-hydroxyphenyl)methane, poly (di-m-hydroxyphenyl)methane, and poly(di-p-hydroxyphenyl)methane. Among these, naphthol novolac resin is preferable, in terms of its water resistance. These may be used singly or in combination of two or more kinds.

The amine compound is not specifically limited, and examples thereof include tetramethyl diaminodiphenylmethane, tetraethyl diaminodiphenylmethane, diethyl dimethyl diaminodiphenylmethane, dimethyl diamino toluene, diamino dibutyl toluene, diamino dipropyl toluene, diaminodiphenyl sulfone, diaminoditolyl sulfone, diethyl diamino toluene, bis(4 amino-3-ethylphenyl)methane, and polytetramethyleneoxide-di-p-aminobenzoate. These may be used singly or in combination of two or more kinds.

The curing agent is preferably used in such an amount that the number of equivalents of the functional group of the curing agent is 0.05 to 1.5 equivalents (e.g., 0.1 to 1.5 equivalents), more preferably, 0.1 to 1.2 equivalents, per one equivalent of the epoxy group. This can improve the curability of the epoxy resin composition and enhance the strength of the cured product.

The curing accelerator is not specifically limited, examples of which include an imidazole-based curing accelerator, a phosphorus-containing curing accelerator, an amine-based curing accelerator, a phosphonium salt-based curing accelerator, bicyclic amidines and derivatives thereof, an organic metal compound or organic metal complex, and a urea product of a polyamine. The curing accelerator is preferably a latent curing accelerator. Examples of the latent curing accelerator include imidazole-based curing accelerator, phosphorus-containing curing accelerator, amine-based curing accelerator, and microcapsule-type curing accelerator. In the case of using a curing accelerator, the curing accelerator is blended in an amount of preferably 0.1 to 40 parts by mass, more preferably 1 to 30 parts by mass, per 100 parts by mass of the curable resin.

Examples of the imidazole-based curing accelerator include imidazole, 2-substituted imidazole compounds (e.g., 2-methylimidazole, 2-ethylimidazole, 1-isobutyl-2-methylimidazole, 2-ethyl-4-methylimidazole, 2-phenylimidazole, 2-phenyl-4-methylimidazole, 1-benzyl-2-methylimidazole, 1-benzyl-2-phenylimidazole, 1,2-dimethylimidazole, 1-cyanoethyl-2-methylimidazole, 1-cyanoethyl-2-ethyl-4-methylimidazole, 1-cyanoethyl-2-undecylimidazole, 1-cyanoethyl-2-phenylimidazole), trimellitates (e.g., 1-cyanoethyl-2-undecylimidazolium trimellitate, 1-cyanoethyl-2-phenylimidazolium trimellitate), triazine adducts (e.g., 2,4-diamino-6-[2'-methylimidazolyl-(1')]-ethyl-s-triazine, 2,4-diamino-6-[2'-undecylimidazolyl-(1')]-ethyl-s-triazine, 2,4-diamino-6-[2'-ethyl-4'-methylimidazolyl-(1')]-ethyl-s-triazine), 2,4-diamino-6-[2'-methylimidazolyl-(1')]-ethyl-s-triazine isocyanuric acid adduct, 2-phenylimidazole isocyanuric acid adduct, 2-methylimidazole isocyanuric acid adduct, 2-phenyl-4,5-dihydroxymethylimidazole, and 2-phenyl-4-methyl-5-dihydroxymethylimidazole.

Examples of the phosphorus-containing curing accelerator include trialkylphosphine compounds (e.g., tributylphosphine), and triarylphosphine compounds (e.g., triphenylphosphine).

Examples of the amine-based curing accelerator include 2,4,6-tris(dimethylaminomethyl)phenol, diethylamine, triethylamine, diethylenetetramine, triethylenetetramine, and 4,4-dimethylaminopyridine. The amine-based curing accelerator may be an amine adduct.

Examples of the organic metal compound or organic metal complex include zinc naphthenate, cobalt naphthenate, tin octylate, cobalt octylate, bis(acetylacetonato)cobalt (II), and tris(acetylacetonato)cobalt(III).

The microcapsule-type curing accelerator may be, for example, a fine particle composition in which an amine compound powder dispersed in an epoxy resin. The amine compound can be selected depending on the desired viscosity increase ratio. Examples of the amine compound include an aliphatic primary amine, an alicyclic primary amine, an aromatic primary amine, an aliphatic secondary amine, an alicyclic secondary amine, an aromatic secondary amine, an imidazole compound, an imidazoline compound, and reaction products of these compounds and a carboxylic acid, a sulfonic acid, an isocyanate or an epoxy compound. These may be used singly or in combination of two or more kinds. For example, an aliphatic primary amine, an alicyclic primary amine, an aromatic primary amine, an aliphatic secondary amine, an alicyclic secondary amine, an aromatic secondary amine, an imidazole compound, or an imidazoline compound may be used in combination with the aforementioned reaction product. The amine compound powder preferably has an average particle diameter of 50 μm or less, more preferably 10 μm or less.

In the present specification, the average particle diameter can be determined as a particle diameter (D50) at 50% cumulative volume in a volumetric particle size distribution measured using a laser diffraction-scattering type particle size distribution analyzer. In the case of using a powder of the amine compound, the melting point or softening point of the amine compound is preferably 60° C. or higher, in view of suppressing an increase in viscosity at room temperature or 25° C.

The curing accelerator may be used singly or in combination of two or more kinds. The curing accelerator is preferably used as a reaction product (adduct) with a resin (e.g., epoxy resin).

The curing accelerator is contained in an amount of, for example, 0.1 parts by mass or more and 20 parts by mass or less, per 100 parts by mass of the curable resin, and may be 1 part by mass or more and 10 parts by mass or less, per 100 parts by mass of the curable resin. When the curing accelerator is an adduct, the amount of the curing accelerator means the net amount of the curing accelerator excluding components other than the curing accelerator.

(Inorganic Filler)

Examples of the inorganic filler include a metal oxide, a metal hydroxide (e.g., magnesium hydroxide), a metal salt (e.g., inorganic acid salt, such as calcium carbonate or dolomite (specifically, carbonate)), and other mineral filler (e.g., talc, wollastonite). Examples of the inorganic filler also include red iron oxide, silicon carbide, and boron nitride (BN). The metal oxide is exemplified by silica (e.g., fused silica), alumina, titania and the like. The inorganic filler may be subjected to surface treatment (e.g., surface treatment with a silane compound or the like). These inorganic fillers can be used singly or in combination of two or more kinds.

The inorganic filler is usually dispersed or mixed in the curable resin composition. Therefore, the inorganic filler is used in a form that can be dispersed or mixed in the curable resin composition. The inorganic filler is preferably, for example, particulate or short-fibrous.

The average particle diameter (D50) of the inorganic filler is, for example, 0.01 μm or more and 100 μm or less.

The inorganic filler is contained in an amount of, per 100 parts by mass of the curable resin, for example, 1 part by mass or more and 5000 parts by mass or less (or 1 part by mass or more and 3000 parts by mass or less), and in terms of having both low warpage and stress relaxation, preferably 10 parts by mass or more and 3000 parts by mass or less.

(Others)

The curable resin composition may optionally contain other components. Other components include a second thermoplastic resin, a polymerization initiator (e.g., radical generator, acid generator, base generator), a polymerization catalyst (e.g., phosphoric catalyst, such as triphenylphosphine, core-shell catalyst), an ion catcher, a flame retardant, a pigment, a carbon black, a coupling agent (e.g., silane coupling agent), a thixotropic agent, and a pre-gelling agent.

The curable resin composition may contain a thermoplastic resin (second thermoplastic resin) other than the first thermoplastic resin. Examples of the second thermoplastic resin include acrylic resin, phenoxy resin, polyolefin, polyurethane, polyether, polyester, polyimide, polyvinyl acetate or saponified product thereof (including polyvinyl alcohol), butyral resin, polyamide, polyvinyl chloride, polyvinylidene chloride, cellulose, thermoplastic epoxy resin, and thermoplastic phenolic resin. Preferred among them is acrylic resin, in terms of its ease of shaping into sheet. The second thermoplastic resin may be contained in an amount of 5 parts by mass or more and 200 parts by mass or less, and may be 10 parts by mass or more and 100 parts by mass or less, per 100 parts by mass of the curable resin.

The second thermoplastic resin may be in any form when added to the resin composition. The second thermoplastic resin may be, for example, particles having an average particle diameter of 0.01 μm or more and 200 μm or less (preferably 0.01 μm or more and 100 μm or less). The particles may have a core-shell structure. In this case, the core may be, for example, a polymer containing a unit derived from at least one monomer selected from the group consisting of n-, i-, and t-butyl(meth)acrylates, and may be a polymer containing a unit derived from a (meth)acrylate other than the above. The shell layer may be, for example, a copolymer of a monofunctional monomer, such as methyl (meth)acrylate, n-, i-, or t-butyl(meth)acrylate, or (meth) acrylic acid, and a polyfunctional monomer, such as 1,6-hexanediol diacrylate. Also, for example, a high-purity second thermoplastic resin dispersed or dissolved in a solvent may be added to the curable resin composition.

The curable resin composition can be prepared, for example, by mixing its components in a predetermined ratio. For example, the components may be blended at a predetermined ratio, and then mixed while being heated as needed. Alternatively, a mixture of the components may be stirred, for example, for 60 minutes to 480 minutes, and then defoamed under reduced pressure.

According to the above aspect, by using the first epoxy resin, the second epoxy resin, and the first thermoplastic resin, each resin can be dispersed in the curable resin composition by merely mixing their constituent components. Adjusting the rotation conditions (e.g., shear rate) for mixing makes it easy to form a favorable phase-separated state of the first epoxy resin and the second epoxy resin.

When the curable resin composition according to the above aspect of the present invention is applied onto an adherend, such as a substrate, and cured, to form a laminate of a layer of the cured product and the adherend, warpage of the laminate occurs because the linear expansion coefficient is usually different between the cured product and the adherend. However, the curable resin composition is excellent in stress relaxation of its cured product, and the warpage of the laminate is relaxed over time when the laminate is allowed to stand for a while. To be more specific, on one principal surface of a disc-shaped substrate of 300 mm in diameter and 200 μm in thickness, a cured product layer of the curable resin composition is formed in a thickness of 200 μm, to obtain a laminate. In this case, the warpage of the laminate after 24 hours from the formation of the cured product layer can be reduced to 50% or less, preferably 40% or less (even more preferably 20% or less), of the warpage of the laminate immediately after the formation of the cured product layer. As above, according to the present invention, warpage can be effectively relaxed. In general, warpage is likely to occur in a laminate of a substrate made of an inorganic material (e.g., glass substrate, silicon substrate, sapphire substrate, compound semiconductor substrate, ceramic substrate), and a cured product layer. According to the present invention, even in the case of using such a substrate made of an inorganic material, warpage can be effectively relaxed.

The cured product layer herein refers to a layer formed by applying the curable resin composition onto one principal surface of a substrate, and heat-treating the applied film at 150° C. for 3 hours. The warpage of the laminate immediately after the formation of the cured product layer refers to a warpage of the laminate in an initial stage after cooling down to room temperature (e.g., 20 to 35° C.) upon completion of the 3-hour heat treatment (e.g., in a stage within 5 minutes after cooling down to room temperature upon completion of the heat treatment). In measurement of the warpage, for example, an average of the level difference between the center of the substrate and the two end points thereof is measured using a laser displacement meter. The measured value can be referred to as a warpage amount. The warpage of the laminate after 24 hours from the formation of the cured product layer is measured at 24 hours after the completion of the 3-hour heat treatment.

The curable resin composition as above can effectively relax the stress of a laminate obtained, even when applied to an adherend, such as a substrate, and cured. The curable resin composition is also suited to use for sheet shaping, and can be used as a curable sheet. In the cured product of the curable resin composition, the stress can be effectively relaxed. Therefore, even when the curable resin composition is applied onto a substrate including a circuit member, and cured, the warpage of a laminate obtained can be relaxed. Accordingly, the curable resin composition and the curable sheet are useful as a sealing material for sealing a substrate including a circuit member (e.g., mounting member), an electronic component, and the like. Also, the curable resin composition and the curable sheet are suited to form a package, such as wafer-level package (WLP) or a panel-level package (PLP), and can also be used for a fan-out panel level package (FOPLP), a fan-out wafer level package (FOWLP), and the like. The curable resin composition and the curable sheet are also suited to seal a large-size electronic component or substrate. The curable resin composition can be also suitably used as a sealing material (mold underfill material) when underfilling and overmolding are performed at once onto an electronic component or substrate with a semiconductor element or the like mounted thereon.

(Curable Sheet)

The curable sheet is formed from the curable resin composition. The curable sheet may be in a semi-cured state (so-called B stage).

The curable sheet is formed from the curable resin composition, using a known sheet shaping method. The curable sheet is formed by shaping the curable resin composition into a sheet using, for example, a die, a roll coater, or a doctor blade. In view of facilitating the sheet shaping, the viscosity of the paste-like curable resin composition used for sheet shaping may be adjusted to 10 mPa or more and 10,000 mPa·s. When a solvent paste is used, the shaped sheet may be dried at 70 to 150° C. for 1 minute to 10 minutes, to remove the solvent. The curable sheet may be formed using a molding method, such as an extrusion molding, compression molding, printing molding, or transfer molding, and may be formed by application using a dispenser or the like. When the paste contains the second thermoplastic resin, heat treatment may be performed after a thin film is formed using the paste. The heat treatment is performed, for example, after forming the paste into a thin film, by heating the thin film at a temperature lower than the curing temperature of the curable resin (e.g., 70 to 150° C.), for example, for 1 minute to 10 minutes.

The curable sheet may be of a single layer or a multilayer having two or more layers. The multilayer sheet may be formed by preparing each layer separately, and then laminating the layers (laminating method), or by coating the material of each layer one on the other (coating method). In the case of a multilayer sheet, at least two adjacent layers may be different in composition (e.g., kind and/or content of the constituent component). Each of the layers can be formed similarly to the above-described sheet shaping method.

The thickness of the curable sheet may be, for example, 50 μm or more and 1000 μm or less, and may be 100 μm or more and 700 μm or less. When the thickness is in the range as above, excellent stress-relaxation effect tends to be ensured, and the warpage can be more effectively relaxed.

(Sealing Using Curable Sheet)

The curable sheet according to the above aspect of the present invention is particularly suited for sealing a substrate including a circuit member (e.g., mounting member), an electronic component, or the like. A description will be given below of sealing using the curable sheet, with reference to a case of sealing a mounting member (or a mounting structure).

Figure 2:
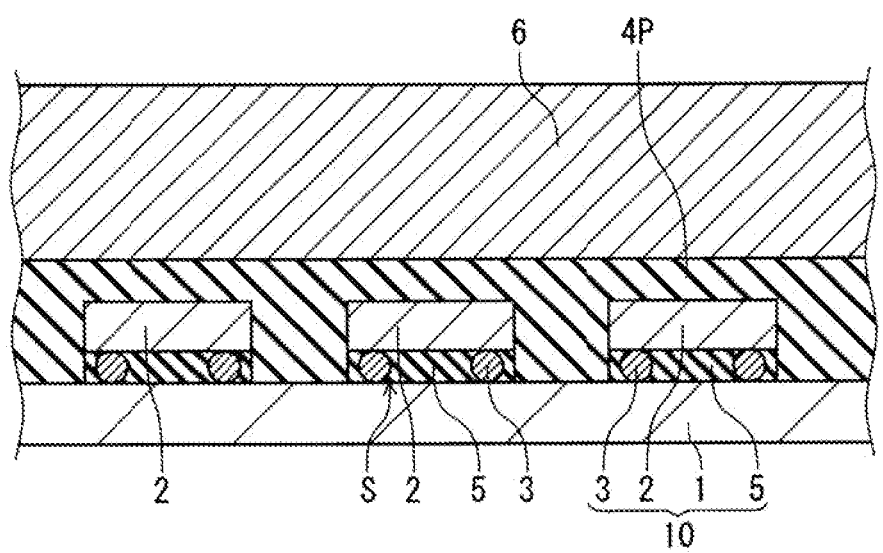
FIG. 2 A schematic cross-sectional view for explaining a step of sealing a circuit member with the curable sheet, in the process of sealing a mounting member including a substrate, using a curable sheet according to an embodiment of the present invention.
Figure 3:
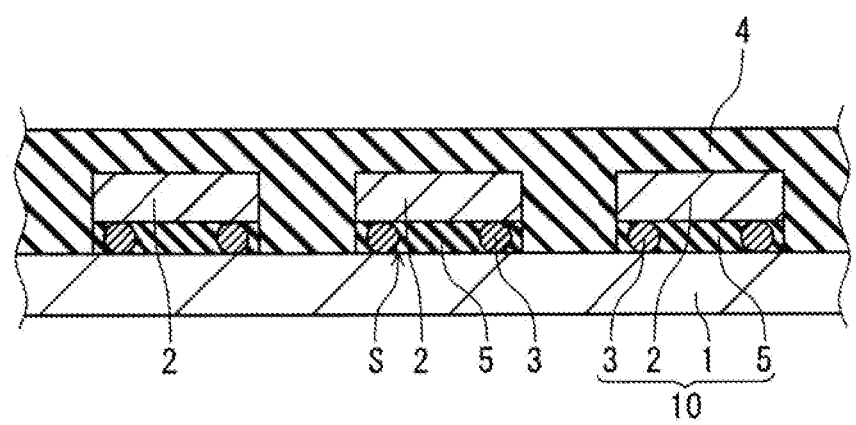
FIG. 3 A schematic cross-sectional view of the mounting member having been sealed using a curable sheet according to an embodiment of the present invention.

FIGS. 1 and 2 are schematic cross-sectional views of a mounting member for explaining the sealing of a mounting member using the curable sheet. FIG. 3 is a schematic cross-sectional view of the mounting member sealed using a cured product of the curable sheet. A mounting member 10 sealed with a cured product 4 of a curable sheet 4P is manufactured by a method including a first preparation step of preparing a mounting member 10, a second preparation step of preparing a curable sheet 4P, a placing step of placing the curable sheet 4P on a mounting member, and a sealing step of sealing a second circuit member 2 with the curable sheet 4P.

(First Preparation Step)

The mounting member 10 including a first circuit member 1 and a plurality of second circuit members 2 mounted on the first circuit member 1 as shown in FIG. 1 is prepared.

The first circuit member 1 is, for example, at least one selected from the group consisting of a semiconductor element, a semiconductor package, a glass substrate, a resin substrate, a silicon substrate, a sapphire substrate, a compound semiconductor substrate, and a ceramic substrate. The first circuit member may have on its surface an electrically conductive material layer, such as ACF (anisotropic conductive film) or ACP (anisotropic conductive paste). The resin substrate may be rigid or flexible, examples of which include an epoxy resin substrate (e.g., glass epoxy substrate), a bismaleimide triazine substrate, a polyimide resin substrate, and a fluororesin substrate. The first circuit member 1 may be a component built-in substrate incorporating a semiconductor chip and the like therein.

The resin composition and the curable sheet according to the above aspect of the present invention are also suitably applicable for resin sealing over a large area. Therefore, the first circuit member may be a large-size substrate (e.g., wafer or panel). The substrate may have a size of, for example, 30,000 mm$^2$ or more. In the case of a wafer, for example, the diameter of the wafer is 200 mm (8 in.) or more. Example of such a wafer include a wafer of 200 mm (8 in.) in diameter and a wafer of 300 mm (12 in.) in diameter. The wafer has, for example, a disc-shape or a shape similar thereto, but the shape is not limited to them. The diameter of the wafer means the diameter of a circle of the planar shape of the disc-shaped wafer, and when the wafer is not disc-shaped, means the diameter of a circle (equivalent circle) having the same area as that of the planar shape of the wafer. In the case of a panel, for example, the length of one side of the panel may be 250 mm or more, and may be 300 mm or more. The panel typically has a rectangular shape or a shape similar thereto, but the shape is not limited to them. Example of such a panel include a panel of 250 mm×350 mm, a panel of 320 mm×320 mm, a panel of 370×470 mm, a panel of 410 mm×515 mm, a panel of 508 mm×610 mm, a panel of 500 mm×510 mm, and a panel of 610 mm×457 mm.

The plurality of the second circuit members 2 may be the same member or different members. In the illustrated example, the plurality of the second circuit members 2 are each a semiconductor element mounted on the first circuit member 1 via bumps 3. A gap S between the first circuit member 1 and the second circuit members 2 is resin-sealed with an underfill material 5. The method of resin-sealing the gap S with the underfill material 5 includes: for example, a method of applying the underfill material 5 in advance onto surfaces facing the first circuit member 1 of the second circuit members 2 (e.g., a method of mounting the second circuit members 2 having sealed with the underfill material 5, onto the first circuit member 1); a method of applying the underfill material 5 onto the first circuit member 1, and then, mounting the second circuit members 2 thereon; and a method of mounting the second circuit members 2 onto the first circuit member 1, and then, allowing the underfill material 5 to enter the gap S. Also, the curable sheet 4P according to the above aspect of the present invention can be used for resin-sealing by underfilling the gap S with the sheet. For example, a mold underfill process may be employed to resin-seal the gap S, in which, after the second circuit members 2 are mounted on the first circuit member 1, underfilling of the gap S is performed, while molding with the curable sheet 4P is performed. Note that, depending on the method or system of connecting the circuit members, there may be a case where the first circuit member 1 and the second circuit members 2 have no gap therebetween, not requiring the resin-sealing with the underfill material 5. The second circuit member 2 may be an electronic component (hollow member) that needs to be sealed (hollow-sealed) with the gap S maintained, without the necessity of disposing the underfill material 5. Examples of the hollow member include RFIC, SAW, a sensor chip (e.g., acceleration sensor), a piezoelectric vibrator chip, a crystal oscillator chip, and a MEMS device. The second circuit member 2 other than the hollow member includes, for example, a semiconductor element, FBAR, BAW, a chip multilayer LC filter, a dielectric filter, and a multilayer ceramic capacitor (MLCC).

In short, the mounting member may have various structures in which the second circuit members 2 are placed on various kinds of the first circuit member 1, such as a chip-on-board (CoB) structure (including chip-on-wafer (CoW), chip-on-film (CoF), and chip-on-glass (CoG)), a chip-on-chip (CoC) structure, a chip-on-package (CoP) structure, and a package-on-package (PoP) structure. The mounting member may be a multi-layered mounting member in which, for example, on the first circuit member 1 with the second circuit members 2 placed thereon, the first member 1 and/or the second circuit members 2 are further placed.

The bumps 3 have electrical conductivity, and the first circuit member 1 and the second circuit member 2 are electrically connected to each other via the bumps 3. The bumps 3 may be made of any material that has electrical conductivity, examples of which include copper, gold, and solder balls.

The underfill material is not specifically limited, and may be any known underfill material, such as an epoxy resin (or resin composition).

(Second Preparation Step)

The curable sheet 4P as shown in FIG. 1 is prepared. The curable sheet 4P is formed as described above.

(Placing Step)

A curable sheet 4P is placed on a mounting member 10, with one principal surface of the curable sheet 4P facing second circuit members 2 (FIG. 1). At this time, a plurality of the second circuit members 2 are covered with one curable sheet 4P. When the sealing area is large, a plurality of curable sheets may be used as necessary, to seal the second circuit members 2.

Although the illustrated example shows an embodiment in which one side of the first circuit member 1 is sealed, both sides may be sealed.

(Sealing Step)

The second circuit members 2 are sealed with the curable sheet 4P. In the sealing step, the curable sheet 4P is pressed against a mounting member 10 (specifically, a first circuit member 1 via the second circuit members 2) with a pressing member 6 (FIG. 2), and the curable sheet 4P is heated and cured. In this way, the second circuit members 2 of the mounting member are sealed with the curable sheet 4P. As a result of the sealing, the second circuit members 2 of the mounting member are covered with a cured product 4 formed by the curing of the curable sheet 4P (FIG. 3). In the case where the second circuit members 2 include a hollow member, in the sealing step, the second circuit members 2 can be sealed, with the gap S maintained.

The pressing of the curable sheet 4P against the first circuit member 1 is performed, for example, while the curable sheet 4P is heated at a temperature lower than the curing temperature of the curable resin contained in the curable sheet 4P (hot pressing). As a result, the curable sheet 4P is brought into close contact with the surfaces of the second circuit members 2 and becomes extendable easily until it reaches the surface of the first circuit member 1 exposed between the second circuit members 2, which can enhance the reliability of the sealing of the second circuit members 2. The hot pressing may be performed under atmospheric pressure or under a reduced pressure atmosphere (e.g., 0.001 to 0.05 MPa). The conditions of heating during pressing are not specifically limited, and may be set as appropriate, according to the pressing method, the kind of the curable resin, and other factors. The heating is performed, for example, at 40 to 200° C. (preferably 50 to 180° C.) for 1 second to 300 minutes (preferably, 3 seconds to 300 minutes).

Subsequently, the curable sheet 4P is heated at the above curing temperature, to cure the curable resin in the curable sheet 4P, so that a cured product 4 is formed. This seals the second circuit members 2, so that the mounting member 10 sealed with the cured product 4 as shown in FIG. 3 is obtained. The conditions of heating of the curable sheet 4P (curing of the curable resin) may be set as appropriate, according to the composition of the curable resin. The curing of the curable resin is performed, for example, at 50 to 200° C. (preferably, 120 to 180° C.) for 1 second to 300 minutes (preferably, 60 minutes to 300 minutes).

The hot pressing and the curing of the curable resin may be performed separately, or simultaneously. For example, after hot-pressing under reduced pressure atmosphere at a temperature lower than the curing temperature of the curable resin contained in the curable sheet 4P, the reduced pressure is released, and heating may be performed under atmospheric pressure at a higher temperature, to cure the curable resin. Alternatively, after hot-pressing under atmospheric pressure at a temperature lower than the curing temperature of the curing resin contained in the curing sheet 4P, heating may be performed at a higher temperature, to cure the curable resin. Alternatively, the hot-pressing may be performed under reduced pressure atmosphere at the curing temperature, so that the curing resin is cured under reduced pressure.

The sealing step may be carried out by a compression molding technique. In the compression molding technique, a known compression molding machine and the like can be used. The molding pressure is, for example, preferably 0.5 MPa to 10 MPa, more preferably 1 MPa to 5 MPa. As for the curing conditions, the curing preferably includes pre-curing (also referred to as heating during molding) and post-curing.

The temperature and the duration of the pre-curing can be set as appropriate. The temperature of the pre-curing is preferably 50 to 200° C., more preferably 70 to 180° C. The duration of the pre-curing is preferably 3 seconds to 30 minutes, more preferably 2 minutes to 15 minutes. Furthermore, heating (heating during molding) can be performed dividedly in multiple stages, to cure the resin. For example, a post-curing performed at 80 to 130° C. for 8 minutes to 12 minutes may be followed by a post-curing performed at 140 to 160° C. for 2 minutes to 5 minutes.

The post-curing is, although depending on the heating conditions during molding, preferably performed at 80 to 200° C., more preferably at 100 to 180° C. The duration of the post-curing is, although depending on the heating conditions during molding, preferably 10 minutes to 300 minutes, more preferably 30 minutes to 180 minutes.

EXAMPLES

The present invention will be specifically described below with reference to Examples and Comparative Examples. It is to be noted, however, that the present invention is not limited to the following Examples.

Examples 1 to 116, Comparative Examples 1 to 2, and Reference Example 1

(1) Preparation of Curable Resin Composition

The components shown in Tables 1 to 11 were each put into a container in a mass ratio shown in Tables 1 to 11, and stirred at 110° C. for 20 minutes, thereby to prepare curable resin compositions.

(2) Formation of Curable Sheet

The curable resin compositions obtained in (1) were each melt-extruded into sheet with a T-die, to form 200-nm-thick sheets (curable sheets).

(3) Production of Laminate

The curable sheets formed in (2) were each used to seal a substrate. The substrate used here was a disc-shaped silicon substrate (diameter: 300 mm, thickness: 200 μm). The curable sheets were each placed so that the thickness after curing became 200 μm. The sealing was performed by placing the curable sheet on semiconductor chips, subsequently pre-curing the curable sheet at 125° C. under reduced pressure atmosphere (4 hPa) for 10 minutes, and then, subjecting them to compression molding while heating at 150° C. for 3 hours.

(4) Evaluation

The warpage of each of the laminates obtained in the above (3) in the initial stage and that after 24 hours from the curing were determined in the above-described procedures, to evaluate the stress relaxation property.

A: The warpage after 24 hours was 20% or less of that in the initial stage.

B: The warpage after 24 hours was more than 20% and 40% or less of that in the initial stage.

C: The warpage after 24 hours was more than 40% and 50% or less of that in the initial stage.

D: The warpage after 24 hours was more than 50% and 60% or less of that in the initial stage.

E: The warpage after 24 hours was more than 60% of that in the initial stage.

The HSP values of the first and second epoxy resins used were determined in the above-described procedures, to calculate the difference therebetween.

The mass ratio (mass %) of the inorganic filler to the whole amount of the constituent components was determined as a filler filling ratio.

Examples 117 to 128

(1) Preparation of Curable Resin Composition

Curable resin compositions being liquid at room temperature were prepared in the same manner as in Example 1, except that the components shown in Table 12 were each used in the mass ratio shown in Table 12.

(2) Production of Laminate

The liquid curable resin compositions prepared in (1) were each used to seal a substrate. The substrate used here was a silicon substrate similar to that in Example 1. The curable resin composition was applied onto the substrate so that the thickness after curing became 200 μm. The curing was performed by pre-curing an applied film of the curable resin composition at 125° C. for 10 minutes, followed by heating at 150° C. for 3 hours.

(3) Evaluation

The evaluation was made in the same manner as in Example 1, except that the laminates obtained in (2) were used.

The results of Examples, Comparative Examples, and Reference Example are shown in Tables 1 to 12.

TABLE 1

| | Kind | Epoxy equiv. (g/eq) | Hydroxyl equiv. (g/eq) | Num. of epoxy functional group | Reactive functional group | Mw | Form | Tg (° C.) | Melting point (° C.) | Com. Ex. 1 | Com. Ex. 2 |
|---|---|---|---|---|---|---|---|---|---|---|---|
| First epoxy resin | PEG diglycidyl ether (n = 9) | 284 | | 2 | | | Liquid | | | | |
| | PEG diglycidyl ether (n = 22) | 551 | | 2 | | | Liquid | | | | |
| Second epoxy resin | Biphenyl-type epoxy | 192 | | 2 | | | Solid | | 105 | 100 | |
| | Liquid glycoluril skeleton epoxy | 83 | | 2< | | | Liquid | | <0 | | |
| | Phenolphthalein type epoxy | 265 | | 2 | | | Solid | | 85 | | 100 |
| | Nitrogen-containing heterocyclic epoxy | 105 | | 2< | | | Solid | | 96 | | |
| | Liquid nitrogen-containing heterocyclic epoxy | 190 | | 2< | | | Liquid | | <0 | | |
| | Bisphenol S-type epoxy | 300 | | 2 | | | Solid | | 75 | | |
| | Ketonic aromatic epoxy | 185 | | 2 | | | Semi-solid | | 40 | | |
| | Triphenylmethane novolac-type epoxy resin | 167 | | 2< | | | Solid | | 54 | | |
| Thermoplastic resin | Polyester resin | | | | Carboxy | 23,000 | Rubbery | 4 | | 200 | 200 |
| | Acrylic resin | | | | Epoxy amide | 350,000 | Pellet | 11 | | | |
| Curing agent | Phenolic curing agent | | 105 | | | | Solid | | 120 | 55 | 40 |
| Inorganic filler | Fused silica (av. particle dia.: 8 μm) | | | | | | | | | 1110 | 1060 |
| Carbon black | | | | | | | | | | 5 | 5 |
| Coupling agent | | | | | | | | | | 2 | 2 |
| Ion catcher | | | | | | | | | | 5 | 5 |
| Curing accelerator | Phosphoric catalyst | | | | | | | | | 3 | 3 |
| | Difference in HSP value | | | | | | | | | — | — |
| | Filler filling ratio | | | | | | | | | 75.0% | 74.9% |
| | Stress relaxation property | | | | | | | | | D | D |

TABLE 1-continued

|  | Kind | Ref. Ex. 1 | Ex. 1 | Ex. 2 | Ex. 3 | Ex. 4 | Ex. 5 | Ex. 6 | Ex. 7 |
|---|---|---|---|---|---|---|---|---|---|
| First epoxy resin | PEG diglycidyl ether (n = 9) |  | 10 | 10 | 10 | 10 | 10 | 10 | 10 |
|  | PEG diglycidyl ether (n = 22) | 10 |  |  |  |  |  |  |  |
| Second epoxy resin | Biphenyl-type epoxy |  |  |  |  |  |  |  |  |
|  | Liquid glycoluril skeleton epoxy |  | 90 |  |  |  |  |  |  |
|  | Phenolphthalein type epoxy | 90 |  | 90 |  |  |  |  |  |
|  | Nitrogen-containing heterocyclic epoxy |  |  |  | 90 |  |  |  |  |
|  | Liquid nitrogen-containing heterocyclic epoxy |  |  |  |  | 90 |  |  |  |
|  | Bisphenol S-type epoxy |  |  |  |  |  | 90 |  |  |
|  | Ketonic aromatic epoxy |  |  |  |  |  |  | 90 |  |
|  | Triphenylmethane novolac-type epoxy resin |  |  |  |  |  |  |  | 90 |
| Thermoplastic resin | Polyester resin |  | 200 | 200 | 200 | 200 | 200 | 200 | 200 |
|  | Acrylic resin | 200 |  |  |  |  |  |  |  |
| Curing agent | Phenolic curing agent | 38 | 118 | 39 | 94 | 53 | 35 | 55 | 60 |
| Inorganic filler | Fused silica (av. particle dia.: 8 μm) | 1050 | 1290 | 1050 | 1210 | 1100 | 1040 | 1100 | 1120 |
| Carbon black |  | 5 | 5 | 5 | 5 | 5 | 5 | 5 | 5 |
| Coupling agent |  | 2 | 2 | 2 | 2 | 2 | 2 | 2 | 2 |
| Ion catcher |  | 5 | 5 | 5 | 5 | 5 | 5 | 5 | 5 |
| Curing accelerator | Phosphoric catalyst | 3 | 3 | 3 | 3 | 3 | 3 | 3 | 3 |
| Difference in HSP value |  | 12 | 6 | 10 | 6 | 6 | 10 | 8 | 7 |
| Filler filling ratio |  | 74.9% | 74.9% | 74.8% | 74.8% | 74.9% | 74.8% | 74.8% | 74.9% |
| Stress relaxation property |  | E | C | B | C | C | B | C | C |

(In the Table, PEG diglycidyl ether is polyethylene glycol diglycidyl ether.)

Table 1 shows that in Comparative Examples 1 and 2 containing no first epoxy resin, the warpage remained large even after 24 hours, and the stress relaxation property was poor. In Reference Example 1 using a thermoplastic resin having a Mw of 350,000, despite using the first epoxy resin and the second epoxy resin in combination, the stress relaxation property was poor.

TABLE 2A

|  | Kind | Epoxy equiv. (g/eq) | Hydroxyl equiv. (g/eq) | Num. of epoxy functional group | Reactive functional group | Mw | Form | Tg (° C.) | Melting point (° C.) | Ex. 8 |
|---|---|---|---|---|---|---|---|---|---|---|
| First epoxy resin | PEG diglycidyl ether (n = 13) | 372 |  | 2 |  |  | Liquid |  |  | 10 |
| Second epoxy resin | Biphenyl-type epoxy | 192 |  | 2 |  |  | Solid |  | 105 | 90 |
|  | Liquid bisphenol A-type epoxy | 189 |  | 2 |  |  | Liquid |  | <0 |  |
|  | Bisphenol F-type epoxy | 192 |  | 2 |  |  | Solid |  | 78 |  |
|  | Dicyclopentadiene-type epoxy | 247 |  | 2< |  |  | Solid |  | 56 |  |
|  | Liquid glycoluril skeleton epoxy | 83 |  | 2< |  |  | Liquid |  | <0 |  |
|  | Phenolphthalein-type epoxy | 265 |  | 2 |  |  | Solid |  | 85 |  |
|  | Nitrogen-containing heterocyclic epoxy | 105 |  | 2< |  |  | Solid |  | 96 |  |
| Thermoplastic resin | Polyester resin |  |  |  | Carboxy | 23,000 | Rubbery | 4 |  | 200 |
| Curing agent | Phenolic curing agent |  | 105 |  |  |  | Solid |  | 120 | 52 |
| Inorganic filler | Fused silica (av. particle dia.: 8 μm) |  |  |  |  |  |  |  |  | 1100 |

TABLE 2A-continued

| | | | | | | | |
|---|---|---|---|---|---|---|---|
| Carbon black | | | | | | | 5 |
| Coupling agent | | | | | | | 2 |
| Ion catcher | | | | | | | 5 |
| Curing accelerator | Phosphoric catalyst | | | | | | 3 |
| | | Difference in HSP value | | | | | 8 |
| | | Filler filling ratio | | | | | 75.0% |
| | | Stress relaxation property | | | | | C |

| | | | Ex. | | | | | |
|---|---|---|---|---|---|---|---|---|
| | Kind | | 9 | 10 | 11 | 12 | 13 | 14 |
| First epoxy resin | PEG diglycidyl ether (n = 13) | | 10 | 10 | 10 | 10 | 10 | 10 |
| Second epoxy resin | Biphenyl-type epoxy | | | | | | | |
| | Liquid bisphenol A-type epoxy | | 90 | | | | | |
| | Bisphenol F-type epoxy | | | 90 | | | | |
| | Dicyclopentadiene-type epoxy | | | | 90 | | | |
| | Liquid glycoluril skeleton epoxy | | | | | 90 | | |
| | Phenolphthalein-type epoxy | | | | | | 90 | |
| | Nitrogen-containing heterocyclic epoxy | | | | | | | 90 |
| Thermo-plastic resin | Polyester resin | | 200 | 200 | 200 | 200 | 200 | 200 |
| Curing agent | Phenolic curing agent | | 53 | 53 | 41 | 117 | 38 | 93 |
| Inorganic filler | Fused silica (av. particle dia.: 8 μm) | | 1100 | 1100 | 1060 | 1290 | 1050 | 1220 |
| Carbon black | | | 5 | 5 | 5 | 5 | 5 | 5 |
| Coupling agent | | | 2 | 2 | 2 | 2 | 2 | 2 |
| Ion catcher | | | 5 | 5 | 5 | 5 | 5 | 5 |
| Curing accelerator | Phosphoric catalyst | | 3 | 3 | 3 | 3 | 3 | 3 |
| Difference in HSP value | | | 7 | 7 | 7 | 6 | 11 | 6 |
| Filler filling ratio | | | 74.9% | 74.9% | 74.9% | 74.9% | 74.8% | 74.9% |
| Stress relaxation property | | | C | C | C | C | A | C |

(In the Table, PEG diglycidyl ether is polyethylene glycol diglycidyl ether.)

TABLE 2B

| | Kind | Epoxy equiv. (g/eq) | Hydroxyl equiv. (g/eq) | Numb. of epoxy functional group | Reactive functional group | Mw | Form | Tg (° C.) | Melting point (° C.) | Ex. 15 |
|---|---|---|---|---|---|---|---|---|---|---|
| First epoxy resin | PEG diglycidyl ether (n = 13) | 372 | | 2 | | | Liquid | | | 10 |
| Second epoxy resin | Liquid nitrogen-containing heterocyclic epoxy | 190 | | 2< | | | Liquid | | <0 | 90 |
| | Bisphenol S-type epoxy | 300 | | 2 | | | Solid | | 75 | |
| | p-aminophenol-type epoxy | 98 | | 2< | | | Liquid | | <0 | |
| | Diaminodiphenylmethane-type epoxy | 120 | | 2< | | | Liquid | | <0 | |
| | Diglycidyl orthotoluidine | 135 | | 2< | | | Liquid | | <0 | |
| | Ketonic aromatic epoxy | 185 | | 2 | | | Semisolid | | 40 | |
| | Triphenylmethane novolac-type epoxy resin | 167 | | 2< | | | Solid | | 54 | |
| Thermo-plastic resin | Polyester resin | | | | Carboxy | 23,000 | Rubbery | 4 | | 200 |
| Curing agent | Phenolic curing agent | | 105 | | | | Solid | | 120 | 53 |
| Inorganic filler | Fused silica (av. particle dia.: 8 μm) | | | | | | | | | 1100 |
| Carbon black | | | | | | | | | | 5 |
| Coupling agent | | | | | | | | | | 2 |
| Ion catcher | | | | | | | | | | 5 |
| Curing accelerator | Phosphoric catalyst | | | | | | | | | 3 |
| | Difference in HSP value | | | | | | | | | 6 |
| | Filler filling ratio | | | | | | | | | 75.0% |
| | Stress relaxation property | | | | | | | | | C |

TABLE 2B-continued

| | Kind | Ex. 16 | Ex. 17 | Ex. 18 | Ex. 19 | Ex. 20 | Ex. 21 |
|---|---|---|---|---|---|---|---|
| First epoxy resin | PEG diglycidyl ether (n = 13) | 10 | 10 | 10 | 10 | 10 | 10 |
| Second epoxy resin | Liquid nitrogen-containing heterocyclic epoxy | | | | | | |
| | Bisphenol S-type epoxy | 90 | | | | | |
| | p-aminophenol-type epoxy | | 90 | | | | |
| | Diaminodiphenylmethane-type epoxy | | | 90 | | | |
| | Diglycidyl orthotoluidine | | | | 90 | | |
| | Ketonic aromatic epoxy | | | | | 90 | |
| | Triphenylmethane novolac-type epoxy resin | | | | | | 90 |
| Thermoplastic resin | Polyester resin | 200 | 200 | 200 | 200 | 200 | 200 |
| Curing agent | Phenolic curing agent | 34 | 99 | 82 | 73 | 54 | 59 |
| Inorganic filler | Fused silica (av. particle dia.: 8 μm) | 1040 | 1230 | 1190 | 1150 | 1100 | 1120 |
| Carbon black | | 5 | 5 | 5 | 5 | 5 | 5 |
| Coupling agent | | 2 | 2 | 2 | 2 | 2 | 2 |
| Ion catcher | | 5 | 5 | 5 | 5 | 5 | 5 |
| Curing accelerator | Phosphoric catalyst | 3 | 3 | 3 | 3 | 3 | 3 |
| Difference in HSP value | | 10 | 6 | 6 | 6 | 9 | 7 |
| Filler filling ratio | | 74.9% | 74.8% | 75.0% | 74.8% | 74.9% | 74.9% |
| Stress relaxation property | | B | C | C | C | B | C |

(In the Table, PEG diglycidyl ether is polyethylene glycol diglycidyl ether.)

TABLE 3A

| | Kind | Epoxy equiv. (g/eq) | Hydroxyl equiv. (g/eq) | Num. of epoxy functional group | Reactive functional group | Mw | Form | Tg (° C.) | Melting point (° C.) | Ex. 22 |
|---|---|---|---|---|---|---|---|---|---|---|
| First epoxy resin | PEG diglycidyl ether (n = 22) | 551 | | 2 | | | Liquid | | | 10 |
| Second epoxy resin | Biphenyl-type epoxy | 192 | | 2 | | | Solid | | 105 | 90 |
| | Liquid bisphenol A-type epoxy | 189 | | 2 | | | Liquid | | <0 | |
| | Bisphenol F-type epoxy | 192 | | 2 | | | Solid | | 78 | |
| | Dicyclopentadiene type epoxy | 247 | | 2 | | | Solid | | 56 | |
| | Liquid glycoluril skeleton epoxy | 83 | | 2< | | | Liquid | | <0 | |
| | Phenolphthalein-type epoxy | 265 | | 2 | | | Solid | | 85 | |
| | Nitrogen-containing heterocyclic epoxy | 105 | | 2< | | | Solid | | 96 | |
| Thermoplastic resin | Polyester resin | | | | Carboxy | 23,000 | Rubbery | 4 | | 200 |
| Curing agent | Phenolic curing agent | | 105 | | | | Solid | | 120 | 51 |
| Inorganic filler | Fused silica (av. particle dia.: 8 μm) | | | | | | | | | 1100 |
| Carbon black | | | | | | | | | | 5 |
| Coupling agent | | | | | | | | | | 2 |
| Ion catcher | | | | | | | | | | 5 |
| Curing accelerator | Phosphoric catalyst | | | | | | | | | 3 |
| Difference in HSP value | | | | | | | | | | 9 |
| Filler filling ratio | | | | | | | | | | 75.0% |
| Stress relaxation property | | | | | | | | | | B |

| | Kind | Ex. 23 | Ex. 24 | Ex. 25 | Ex. 26 | Ex. 27 | Ex. 28 |
|---|---|---|---|---|---|---|---|
| First epoxy resin | PEG diglycidyl ether (n = 22) | 10 | 10 | 10 | 10 | 10 | 10 |
| Second epoxy resin | Biphenyl-type epoxy | | | | | | |
| | Liquid bisphenol A-type epoxy | 90 | | | | | |

TABLE 3A-continued

|  |  | | | | | | |
|---|---|---|---|---|---|---|---|
|  | Bisphenol F-type epoxy | 90 | | | | | |
|  | Dicyclopentadiene type epoxy | | 90 | | | | |
|  | Liquid glycoluril skeleton epoxy | | | 90 | | | |
|  | Phenolphthalein-type epoxy | | | | 90 | | |
|  | Nitrogen-containing heterocyclic epoxy | | | | | 90 | |
| Thermoplastic resin | Polyester resin | 200 | 200 | 200 | 200 | 200 | 200 |
| Curing agent | Phenolic curing agent | 52 | 51 | 40 | 116 | 38 | 92 |
| Inorganic filler | Fused silica (av. particle dia.: 8 μm) | 1100 | 1100 | 1060 | 1290 | 1050 | 1220 |
| Carbon black |  | 5 | 5 | 5 | 5 | 5 | 5 |
| Coupling agent |  | 2 | 2 | 2 | 2 | 2 | 2 |
| Ion catcher |  | 5 | 5 | 5 | 5 | 5 | 5 |
| Curing accelerator | Phosphoric catalyst | 3 | 3 | 3 | 3 | 3 | 3 |
| Difference in HSP value |  | 7 | 9 | 9 | 7 | 12 | 7 |
| Filler filling ratio |  | 75.0% | 75.0% | 74.9% | 75.0% | 74.9% | 75.0% |
| Stress relaxation property |  | C | B | B | B | A | B |

(In the Table, PEG diglycidyl ether is polyethylene glycol diglycidyl ether.)

TABLE 3B

|  | Kind | Epoxy equiv. (g/eq) | Hydroxyl equiv. (g/eq) | Num. of epoxy functional group | Reactive functional group | Mw | Form | Tg (° C.) | Melting point (° C.) | Ex. 29 |
|---|---|---|---|---|---|---|---|---|---|---|
| First epoxy resin | PEG diglycidyl ether (n = 22) | 551 | | 2 | | | Liquid | | | 10 |
| Second epoxy resin | Liquid nitrogen-containing heterocyclic epoxy | 190 | | 2< | | | Liquid | <0 | | 90 |
|  | Bisphenol S-type epoxy | 300 | | 2 | | | Solid | | 75 | |
|  | p-aminophenol-type epoxy | 98 | | 2< | | | Liquid | <0 | | |
|  | Diaminodiphenylmethane-type epoxy | 120 | | 2< | | | Liquid | <0 | | |
|  | Diglycidyl orthotoluidine | 135 | | 2< | | | Liquid | <0 | | |
|  | Ketonic aromatic epoxy | 185 | | 2 | | | Semisolid | | 40 | |
|  | Triphenylmethane novolac-type epoxy resin | 167 | | 2< | | | Solid | | 54 | |
| Thermoplastic resin | Polyester resin | | | | Carboxy | 23,000 | Rubbery | 4 | | 200 |
| Curing agent | Phenolic curing agent | | 105 | | | | Solid | | 120 | 52 |
| Inorganic filler | Fused silica (av. particle dia.: 8 μm) | | | | | | | | | 1100 |
| Carbon black |  | | | | | | | | | 5 |
| Coupling agent |  | | | | | | | | | 2 |
| Ion catcher |  | | | | | | | | | 5 |
| Curing accelerator | Phosphoric catalyst | | | | | | | | | 3 |
| Difference in HSP value |  | | | | | | | | | 7 |
| Filler filling ratio |  | | | | | | | | | 75.0% |
| Stress relaxation property |  | | | | | | | | | B |

|  |  | Ex. | | | | | |
|---|---|---|---|---|---|---|---|
|  | Kind | 30 | 31 | 32 | 33 | 34 | 35 |
| First epoxy resin | PEG diglycidyl ether (n = 22) | 10 | 10 | 10 | 10 | 10 | 10 |
| Second epoxy resin | Liquid nitrogen-containing heterocyclic epoxy | | | | | | |
|  | Bisphenol S-type epoxy | 90 | | | | | |
|  | p-aminophenol-type epoxy | | 90 | | | | |
|  | Diaminodiphenylmethane-type epoxy | | | 90 | | | |
|  | Diglycidyl orthotoluidine | | | | 90 | | |
|  | Ketonic aromatic epoxy | | | | | 90 | |
|  | Triphenylmethane novolac-type epoxy resin | | | | | | 90 |
| Thermoplastic resin | Polyester resin | 200 | 200 | 200 | 200 | 200 | 200 |

TABLE 3B-continued

| | | | | | | | |
|---|---|---|---|---|---|---|---|
| Curing agent | Phenolic curing agent | 33 | 98 | 81 | 72 | 53 | 58 |
| Inorganic filler | Fused silica (av. particle dia.: 8 μm) | 1040 | 1230 | 1190 | 1150 | 1100 | 1120 |
| Carbon black | | 5 | 5 | 5 | 5 | 5 | 5 |
| Coupling agent | | 2 | 2 | 2 | 2 | 2 | 2 |
| Ion catcher | | 5 | 5 | 5 | 5 | 5 | 5 |
| Curing accelerator | Phosphoric catalyst | 3 | 3 | 3 | 3 | 3 | 3 |
| Difference in HSP value | | 11 | 7 | 7 | 7 | 10 | 9 |
| Filler filling ratio | | 74.90% | 74.8% | 75.0% | 74.8% | 74.9% | 75.0% |
| Stress relaxation property | | A | B | B | B | B | B |

(In the Table, PEG diglycidyl ether is polyethylene glycol diglycidyl ether.)

TABLE 4

| | Kind | Epoxy equiv. (g/eq) | Hydroxyl equiv. (g/eq) | Num. of epoxy functional group | Reactive functional group | Mw | Form | Tg (° C.) | Melting point (° C.) | Ex. 36 | Ex. 37 |
|---|---|---|---|---|---|---|---|---|---|---|---|
| First epoxy resin | PPG diglycidyl ether (n = 7 to 8) | 320 | | 2 | | | Liquid | | | 10 | 10 |
| Second epoxy resin | Bisphenol F-type epoxy | 192 | | 2 | | | Solid | 78 | | 90 | |
| | Liquid glycoluril skeleton epoxy | 83 | | 2< | | | Liquid | <0 | | | 90 |
| | Phenolphthalein-type epoxy | 265 | | 2 | | | Solid | 85 | | | |
| | Bisphenol S-type epoxy | 300 | | 2 | | | Solid | 75 | | | |
| | p-aminophenol-type epoxy | 98 | | 2< | | | Liquid | <0 | | | |
| | Diaminodiphenylmethane-type epoxy | 120 | | 2< | | | Liquid | <0 | | | |
| | Diglycidyl orthotoluidine | 135 | | 2< | | | Liquid | <0 | | | |
| | Ketonic aromatic epoxy | 185 | | 2 | | | Semisolid | 40 | | | |
| | Triphenylmethane novolac-type epoxy resin | 167 | | 2< | | | Solid | 54 | | | |
| Thermo-plastic resin | Polyester resin | | | | Carboxy | 23,000 | Rubbery | 4 | | 200 | 200 |
| Curing agent | Phenolic curing agent | | 105 | | | | Solid | 120 | | 53 | 117 |
| Inorganic filler | Fused silica (av. particle dia.: 8 μm) | | | | | | | | | 1100 | 1290 |
| Carbon black | | | | | | | | | | 5 | 5 |
| Coupling agent | | | | | | | | | | 2 | 2 |
| Ion catcher | | | | | | | | | | 5 | 5 |
| Curing accelerator | Phosphoric catalyst | | | | | | | | | 3 | 3 |
| | Difference in HSP value | | | | | | | | | 8 | 7 |
| | Filler filling ratio | | | | | | | | | 75.0% | 74.9% |
| | Stress relaxation property | | | | | | | | | C | C |

| | Kind | Ex. 38 | Ex. 39 | Ex. 40 | Ex. 41 | Ex. 42 | Ex. 43 | Ex. 44 |
|---|---|---|---|---|---|---|---|---|
| First epoxy resin | PPG diglycidyl ether (n = 7 to 8) | 10 | 10 | 10 | 10 | 10 | 10 | 10 |
| Second epoxy resin | Bisphenol F-type epoxy | | | | | | | |
| | Liquid glycoluril skeleton epoxy | | | | | | | |
| | Phenolphthalein-type epoxy | 90 | | | | | | |
| | Bisphenol S-type epoxy | | 90 | | | | | |
| | p-aminophenol-type epoxy | | | 90 | | | | |
| | Diaminodiphenylmethane-type epoxy | | | | 90 | | | |
| | Diglycidyl orthotoluidine | | | | | 90 | | |
| | Ketonic aromatic epoxy | | | | | | 90 | |
| | Triphenylmethane novolac-type epoxy resin | | | | | | | 90 |
| Thermo-plastic resin | Polyester resin | 200 | 200 | 200 | 200 | 200 | 200 | 200 |
| Curing agent | Phenolic curing agent | 39 | 35 | 100 | 82 | 73 | 54 | 60 |
| Inorganic filler | Fused silica (av. particle dia.: 8 μm) | 1050 | 1040 | 1230 | 1190 | 1150 | 1100 | 1120 |
| Carbon black | | 5 | 5 | 5 | 5 | 5 | 5 | 5 |

TABLE 4-continued

|  |  |  |  |  |  |  |  |  |
|---|---|---|---|---|---|---|---|---|
| Coupling agent |  | 2 | 2 | 2 | 2 | 2 | 2 | 2 |
| Ion catcher |  | 5 | 5 | 5 | 5 | 5 | 5 | 5 |
| Curing accelerator | Phosphoric catalyst | 3 | 3 | 3 | 3 | 3 | 3 | 3 |
| Difference in HSP value |  | 10 | 9 | 6 | 6 | 6 | 7 | 7 |
| Filler filling ratio |  | 74.8% | 74.8% | 74.8% | 75.0% | 74.8% | 74.9% | 74.9% |
| Stress relaxation property |  | B | B | C | C | C | B | C |

(In the Table, PPG diglycidyl ether is polypropylene glycol diglycidyl ether.)

TABLE 5

|  | Kind | Epoxy equiv. (g/eq) | Hydroxyl equiv. (g/eq) | Num. of epoxy functional group | Reactive functional group | Mw | Form | Tg (°C.) | Melting point (°C.) | Ex. 45 | Ex. 46 |
|---|---|---|---|---|---|---|---|---|---|---|---|
| First epoxy resin | PPG diglycidyl ether (n = 11) | 471 |  | 2 |  |  | Liquid |  |  | 10 | 10 |
| Second epoxy resin | Biphenyl-type epoxy | 192 |  | 2 |  |  | Solid |  | 105 | 90 |  |
|  | Liquid glycoluril skeleton epoxy | 83 |  | 2< |  |  | Liquid |  | <0 |  | 90 |
|  | Phenolphthalein-type epoxy | 265 |  | 2 |  |  | Solid |  | 85 |  |  |
|  | Bisphenol S-type epoxy | 300 |  | 2 |  |  | Solid |  | 75 |  |  |
|  | p-aminophenol-type epoxy | 98 |  | 2< |  |  | Liquid |  | <0 |  |  |
|  | Diaminodiphenylmethane-type epoxy | 120 |  | 2< |  |  | Liquid |  | <0 |  |  |
|  | Diglycidyl orthotoluidine | 135 |  | 2< |  |  | Liquid |  | <0 |  |  |
|  | Ketonic aromatic epoxy | 185 |  | 2 |  |  | Semisolid |  | 40 |  |  |
|  | Triphenylmethane novolac-type epoxy resin | 167 |  | 2< |  |  | Solid |  | 54 |  |  |
| Thermo-plastic resin | Polyester resin |  |  |  | Carboxy | 23,000 | Rubbery | 4 |  | 200 | 200 |
| Curing agent | Phenolic curing agent |  | 105 |  |  |  | Solid |  | 120 | 51 | 116 |
| Inorganic filler | Fused silica (av. particle dia.: 8 μm) |  |  |  |  |  |  |  |  | 1100 | 1290 |
| Carbon black |  |  |  |  |  |  |  |  |  | 5 | 5 |
| Coupling agent |  |  |  |  |  |  |  |  |  | 2 | 2 |
| Ion catcher |  |  |  |  |  |  |  |  |  | 5 | 5 |
| Curing accelerator | Phosphoric catalyst |  |  |  |  |  |  |  |  | 3 | 3 |
| Difference in HSP value |  |  |  |  |  |  |  |  |  | 7 | 7 |
| Filler filling ratio |  |  |  |  |  |  |  |  |  | 75.0% | 75.0% |
| Stress relaxation property |  |  |  |  |  |  |  |  |  | C | C |

|  | Kind | Ex. 47 | Ex. 48 | Ex. 49 | Ex. 50 | Ex. 51 | Ex. 52 | Ex. 53 |
|---|---|---|---|---|---|---|---|---|
| First epoxy resin | PPG diglycidyl ether (n = 11) | 10 | 10 | 10 | 10 | 10 | 10 | 10 |
| Second epoxy resin | Biphenyl-type epoxy |  |  |  |  |  |  |  |
|  | Liquid glycoluril skeleton epoxy |  |  |  |  |  |  |  |
|  | Phenolphthalein-type epoxy | 90 |  |  |  |  |  |  |
|  | Bisphenol S-type epoxy |  | 90 |  |  |  |  |  |
|  | p-aminophenol-type epoxy |  |  | 90 |  |  |  |  |
|  | Diaminodiphenylmethane-type epoxy |  |  |  | 90 |  |  |  |
|  | Diglycidyl orthotoluidine |  |  |  |  | 90 |  |  |
|  | Ketonic aromatic epoxy |  |  |  |  |  | 90 |  |
|  | Triphenylmethane novolac-type epoxy resin |  |  |  |  |  |  | 90 |
| Thermo-plastic resin | Polyester resin | 200 | 200 | 200 | 200 | 200 | 200 | 200 |
| Curing agent | Phenolic curing agent | 38 | 34 | 99 | 81 | 72 | 53 | 59 |
| Inorganic filler | Fused silica (av. particle dia.: 8 μm) | 1050 | 1040 | 1230 | 1190 | 1150 | 1100 | 1120 |
| Carbon black |  | 5 | 5 | 5 | 5 | 5 | 5 | 5 |
| Coupling agent |  | 2 | 2 | 2 | 2 | 2 | 2 | 2 |
| Ion catcher |  | 5 | 5 | 5 | 5 | 5 | 5 | 5 |
| Curing accelerator | Phosphoric catalyst | 3 | 3 | 3 | 3 | 3 | 3 | 3 |

TABLE 5-continued

|  | | | | | | | |
|---|---|---|---|---|---|---|---|
| Difference in HSP value | 11 | 10 | 6 | 6 | 6 | 7 | 7 |
| Filler filling ratio | 74.8% | 74.9% | 74.8% | 75.0% | 74.8% | 74.9% | 75.0% |
| Stress relaxation property | A | B | C | C | C | B | B |

(In the Table, PPG diglycidyl ether is polypropylene glycol diglycidyl ether.)

TABLE 6

| | Kind | Epoxy equiv. (g/eq) | Hydroxyl equiv. (g/eq) | Num. of epoxy functional group | Reactive functional group | Mw | Form | Tg (° C.) | Melting point (° C.) | Ex. 54 | Ex. 55 |
|---|---|---|---|---|---|---|---|---|---|---|---|
| First epoxy resin | PBG diglycidyl ether (n = 8 to 9) | 450 | | 2 | | | Liquid | | | 10 | 10 |
| Second epoxy resin | Liquid glycoluril skeleton epoxy | 83 | | 2< | | | Liquid | <0 | | 90 | |
| | Phenolphthalein-type epoxy | 265 | | 2 | | | Solid | 85 | | | 90 |
| | Nitrogen-containing heterocyclic epoxy | 105 | | 2< | | | Solid | 96 | | | |
| | Liquid nitrogen-containing heterocyclic epoxy | 190 | | 2< | | | Liquid | <0 | | | |
| | Bisphenol S-type epoxy | 300 | | 2 | | | Solid | 75 | | | |
| | p-aminophenol-type epoxy | 98 | | 2< | | | Liquid | <0 | | | |
| | Diaminodiphenylmethane-type epoxy | 120 | | 2< | | | Liquid | <0 | | | |
| | Diglycidyl orthotoluidine | 135 | | 2< | | | Liquid | <0 | | | |
| | Ketonic aromatic epoxy | 185 | | 2 | | | Semisolid | 40 | | | |
| | Triphenylmethane novolac-type epoxy resin | 167 | | 2< | | | Solid | 54 | | | |
| Thermoplastic resin | Polyester resin | | | | Carboxy | 23,000 | Rubbery | 4 | | 200 | 200 |
| Curing agent | Phenolic curing agent | | 105 | | | | Solid | | 120 | 116 | 38 |
| Inorganic filler | Fused silica (av. particle dia.: 8 μm) | | | | | | | | | 1290 | 1050 |
| Carbon black | | | | | | | | | | 5 | 5 |
| Coupling agent | | | | | | | | | | 2 | 2 |
| Ion catcher | | | | | | | | | | 5 | 5 |
| Curing accelerator | Phosphoric catalyst | | | | | | | | | 3 | 3 |
| | Difference in HSP value | | | | | | | | | 8 | 10 |
| | Filler filling ratio | | | | | | | | | 74.9% | 74.8% |
| | Stress relaxation property | | | | | | | | | B | B |

| | Kind | Ex. 56 | Ex. 57 | Ex. 58 | Ex. 59 | Ex. 60 | Ex. 61 | Ex. 62 | Ex. 63 |
|---|---|---|---|---|---|---|---|---|---|
| First epoxy resin | PBG diglycidyl ether (n = 8 to 9) | 10 | 10 | 10 | 10 | 10 | 10 | 10 | 10 |
| Second epoxy resin | Liquid glycoluril skeleton epoxy | | | | | | | | |
| | Phenolphthalein-type epoxy | | | | | | | | |
| | Nitrogen-containing heterocyclic epoxy | 90 | | | | | | | |
| | Liquid nitrogen-containing heterocyclic epoxy | | 90 | | | | | | |
| | Bisphenol S-type epoxy | | | 90 | | | | | |
| | p-aminophenol-type epoxy | | | | 90 | | | | |
| | Diaminodiphenylmethane-type epoxy | | | | | 90 | | | |
| | Diglycidyl orthotoluidine | | | | | | 90 | | |
| | Ketonic aromatic epoxy | | | | | | | 90 | |
| | Triphenylmethane novolac-type epoxy resin | | | | | | | | 90 |
| Thermoplastic resin | Polyester resin | 200 | 200 | 200 | 200 | 200 | 200 | 200 | 200 |

TABLE 6-continued

| | | | | | | | | | |
|---|---|---|---|---|---|---|---|---|---|
| Curing agent | Phenolic curing agent | 92 | 52 | 34 | 99 | 81 | 72 | 53 | 59 |
| Inorganic filler | Fused silica (av. particle dia.: 8 μm) | 1220 | 1100 | 1040 | 1230 | 1190 | 1150 | 1100 | 1120 |
| Carbon black | | 5 | 5 | 5 | 5 | 5 | 5 | 5 | 5 |
| Coupling agent | | 2 | 2 | 2 | 2 | 2 | 2 | 2 | 2 |
| Ion catcher | | 5 | 5 | 5 | 5 | 5 | 5 | 5 | 5 |
| Curing accelerator | Phosphoric catalyst | 3 | 3 | 3 | 3 | 3 | 3 | 3 | 3 |
| Difference in HSP value | | 6 | 6 | 11 | 7 | 7 | 7 | 6 | 7 |
| Filler filling ratio | | 75.0% | 75.0% | 74.9% | 74.8% | 75.0% | 74.8% | 74.9% | 75.0% |
| Stress relaxation property | | C | C | A | C | C | C | C | B |

(In the Table, PBG diglycidyl ether is polybutylene glycol diglycidyl ether.)

TABLE 7

| | Kind | Epoxy equiv. (g/eq) | Hydroxyl equiv. (g/eq) | Num. of epoxy functional group | Reactive functional group | Mw | Form | Tg (°C.) | Melting point (°C.) | Ex. 64 | Ex. 65 |
|---|---|---|---|---|---|---|---|---|---|---|---|
| First epoxy resin | PBG diglycidyl ether (n = 11) | 450 | | 2 | | | Liquid | | 10 | 10 | 10 |
| Second epoxy resin | Liquid glycoluril skeleton epoxy | 83 | | 2< | | | Liquid | <0 | | 90 | |
| | Phenolphthalein-type epoxy | 265 | | 2 | | | Solid | | 85 | | 90 |
| | Nitrogen-containing heterocyclic epoxy | 105 | | 2< | | | Solid | | 96 | | |
| | Liquid nitrogen-containing heterocyclic epoxy | 190 | | 2< | | | Liquid | <0 | | | |
| | Bisphenol S-type epoxy | 300 | | 2 | | | Solid | | 75 | | |
| | p-aminophenol-type epoxy | 98 | | 2< | | | Liquid | <0 | | | |
| | Diaminodiphenylmethane-type epoxy | 120 | | 2< | | | Liquid | <0 | | | |
| | Diglycidyl orthotoluidine | 135 | | 2< | | | Liquid | <0 | | | |
| | Ketonic aromatic epoxy | 185 | | 2 | | | Semisolid | | 40 | | |
| | Triphenylmethane novolac-type epoxy resin | 167 | | 2< | | | Solid | | 54 | | |
| Thermoplastic resin | Polyester resin | | | | Carboxy | 23,000 | Rubbery | 4 | 200 | 200 | |
| Curing agent | Phenolic curing agent | | 105 | | | | Solid | | 120 | 115 | 37 |
| Inorganic filler | Fused silica (av. particle dia.: 8 μm) | | | | | | | | | 1290 | 1050 |
| Carbon black | | | | | | | | | | 5 | 5 |
| Coupling agent | | | | | | | | | | 2 | 2 |
| Ion catcher | | | | | | | | | | 5 | 5 |
| Curing accelerator | Phosphoric catalyst | | | | | | | | | 3 | 3 |
| Difference in HSP value | | | | | | | | | | 7 | 10 |
| Filler filling ratio | | | | | | | | | | 75.0% | 74.9% |
| Stress relaxation property | | | | | | | | | | B | B |

| | Kind | Ex. 66 | Ex. 67 | Ex. 68 | Ex. 69 | Ex. 70 | Ex. 71 | Ex. 72 | Ex. 73 |
|---|---|---|---|---|---|---|---|---|---|
| First epoxy resin | PBG diglycidyl ether (n = 11) | 10 | 10 | 10 | 10 | 10 | 10 | 10 | 10 |
| Second epoxy resin | Liquid glycoluril skeleton epoxy | | | | | | | | |
| | Phenolphthalein-type epoxy | | | | | | | | |
| | Nitrogen-containing heterocyclic epoxy | 90 | | | | | | | |
| | Liquid nitrogen-containing heterocyclic epoxy | | 90 | | | | | | |
| | Bisphenol S-type epoxy | | | 90 | | | | | |
| | p-aminophenol-type epoxy | | | | 90 | | | | |
| | Diaminodiphenylmethane-type epoxy | | | | | 90 | | | |
| | Diglycidyl orthotoluidine | | | | | | 90 | | |

TABLE 7-continued

| | | | | | | | | | |
|---|---|---|---|---|---|---|---|---|---|
| | Ketonic aromatic epoxy | | | | | | | 90 | |
| | Triphenylmethane novolac-type epoxy resin | | | | | | | | 90 |
| Thermoplastic resin | Polyester resin | 200 | 200 | 200 | 200 | 200 | 200 | 200 | 200 |
| Curing agent | Phenolic curing agent | 92 | 51 | 33 | 98 | 80 | 72 | 53 | 58 |
| Inorganic filler | Fused silica (av. particle dia.: 8 μm) | 1220 | 1100 | 1040 | 1230 | 1190 | 1150 | 1100 | 1120 |
| Carbon black | | 5 | 5 | 5 | 5 | 5 | 5 | 5 | 5 |
| Coupling agent | | 2 | 2 | 2 | 2 | 2 | 2 | 2 | 2 |
| Ion catcher | | 5 | 5 | 5 | 5 | 5 | 5 | 5 | 5 |
| Curing accelerator | Phosphoric catalyst | 3 | 3 | 3 | 3 | 3 | 3 | 3 | 3 |
| Difference in HSP value | | 7 | 7 | 11 | 7 | 7 | 7 | 6 | 7 |
| Filler filling ratio | | 75.0% | 75.0% | 74.9% | 74.9% | 75.1% | 74.8% | 75.0% | 75.0% |
| Stress relaxation property | | C | C | A | C | C | C | C | B |

(In the Table, PBG diglycidyl ether is polybutylene glycol diglycidyl ether.)

TABLE 8A

| | | Kind | Epoxy equiv. (g/eq) | Hydroxyl equiv. (g/eq) | Num. of epoxy functional group | Reactive functional group | Mw | Form | Tg (° C.) | Melting point (° C.) | Ex. 74 |
|---|---|---|---|---|---|---|---|---|---|---|---|
| First epoxy resin | | PEG diglycidyl ether (n = 22) | 551 | | 2 | | | Liquid | | | 10 |
| Second epoxy resin | | Phenolphthalein-type epoxy | 265 | | 2 | | | Solid | | 85 | 90 |
| Thermoplastic resin | | Polyester resin | | | | Carboxy | 19,000 | Rubbery | 7 | | 200 |
| | | Polyester resin | | | | Carboxy | 24,000 | Rubbery | 10 | | |
| | | Polyester resin | | | | Carboxy | 23,000 | Rubbery | 7 | | |
| | | Polyester resin | | | | Carboxy | 11,000 | Pellet | 36 | | |
| | | Polyester resin | | | | Carboxy | 7,000 | Pellet | 15 | | |
| | | Polyester resin | | | | Carboxy | 30,000 | Pellet | −20 | | |
| | | Acrylic resin | | | | Epoxy amide | 350,000 | Pellet | 11 | | |
| Curing agent | | Phenolic curing agent | | 105 | | | | Solid | | 120 | 38 |
| Inorganic filler | | Fused silica (av. particle dia.: 8 μm) | | | | | | | | | 1050 |
| Carbon black | | | | | | | | | | | 5 |
| Coupling agent | | | | | | | | | | | 2 |
| Ion catcher | | | | | | | | | | | 5 |
| Curing accelerator | | Phosphoric catalyst | | | | | | | | | 3 |
| | | Difference in HSP value | | | | | | | | | 12 |
| | | Filler filling ratio | | | | | | | | | 74.9% |
| | | Stress relaxation property | | | | | | | | | A |

| | | | Ex. | | | | | Ref. Ex. |
|---|---|---|---|---|---|---|---|---|
| | | Kind | 75 | 76 | 77 | 78 | 79 | 1 |
| First epoxy resin | | PEG diglycidyl ether (n = 22) | 10 | 10 | 10 | 10 | 10 | 10 |
| Second epoxy resin | | Phenolphthalein-type epoxy | 90 | 90 | 90 | 90 | 90 | 90 |
| Thermoplastic resin | | Polyester resin | | | | | | |
| | | Polyester resin | 200 | | | | | |
| | | Polyester resin | | 200 | | | | |
| | | Polyester resin | | | 200 | | | |
| | | Polyester resin | | | | 200 | | |
| | | Polyester resin | | | | | 200 | |
| | | Acrylic resin | | | | | | 200 |
| Curing agent | | Phenolic curing agent | 38 | 38 | 38 | 38 | 38 | 38 |
| Inorganic filler | | Fused silica (av. particle dia.: 8 μm) | 1050 | 1050 | 1050 | 1050 | 1050 | 1050 |
| Carbon black | | | 5 | 5 | 5 | 5 | 5 | 5 |
| Coupling agent | | | 2 | 2 | 2 | 2 | 2 | 2 |
| Ion catcher | | | 5 | 5 | 5 | 5 | 5 | 5 |
| Curing accelerator | | Phosphoric catalyst | 3 | 3 | 3 | 3 | 3 | 3 |

TABLE 8A-continued

| | | | | | | |
|---|---|---|---|---|---|---|
| Difference in HSP value | 12 | 12 | 12 | 12 | 12 | 12 |
| Filler filling ratio | 74.9% | 74.9% | 74.9% | 74.9% | 74.9% | 74.9% |
| Stress relaxation property | A | A | A | A | A | E |

(In the Table, PEG diglycidyl ether is polyethylene glycol diglycidyl ether.)

TABLE 8B

| | Kind | Epoxy equiv. (g/eq) | Hydroxyl equiv. (g/eq) | Num. of epoxy functional group | Reactive functional group | Mw | Form | Tg (°C.) | Melting point (°C.) | Ex. 80 | Ex. 81 |
|---|---|---|---|---|---|---|---|---|---|---|---|
| First epoxy resin | PEG diglycidyl ether (n = 22) | 551 | | 2 | | | Liquid | | | 10 | 30 |
| Second epoxy resin | Phenolphthalein-type epoxy | 265 | | 2 | | | Solid | 85 | | 90 | 70 |
| Thermoplastic resin | Polyester resin | | | | Carboxy | 10,000 | Pellet | −3 | 200 | | |
| | Silicone resin | | | | Epoxy | 5,200 | Liquid | <0 | | | 40 |
| | Silicone resin | | | | Epoxy | 7,100 | Liquid | <0 | | | |
| | Silicone resin | | | | Epoxy | 11,000 | Liquid | <0 | | | |
| | Polyamide resin | | | | Amino | 36,000 | Pellet | −66 | | | |
| | Acrylic resin | | | | Epoxy | 200,000 | Rubbery | −30 | | | |
| | Acrylic resin | | | | Epoxy | 100,000 | Rubbery | 5 | | | |
| | Acrylic resin | | | | Epoxy | 100,000 | Rubbery | 5 | | | |
| | Acrylic resin | | | | Epoxy | 100,000 | Rubbery | −10 | | | |
| Curing agent | Phenolic curing agent | | 105 | | | | Solid | | 120 | 38 | 33 |
| Inorganic filler | Fused silica (av. particle dia.: 8 μm) | | | | | | | | | 1050 | 1070 |
| Carbon black | | | | | | | | | | 5 | 5 |
| Coupling agent | | | | | | | | | | 2 | 2 |
| Ion catcher | | | | | | | | | | 5 | 5 |
| Curing accelerator | Phosphoric catalyst | | | | | | | | | 3 | 3 |
| | Difference in HSP value | | | | | | | | | 12 | 12 |
| | Filler filling ratio | | | | | | | | | 74.9% | 85.0% |
| | Stress relaxation property | | | | | | | | | A | A |

| | | Ex. | | | | | | |
|---|---|---|---|---|---|---|---|---|
| | Kind | 82 | 83 | 84 | 85 | 86 | 87 | 88 |
| First epoxy resin | PEG diglycidyl ether (n = 22) | 30 | 30 | 10 | 10 | 10 | 10 | 10 |
| Second epoxy resin | Phenolphthalein-type epoxy | 70 | 70 | 90 | 90 | 90 | 90 | 90 |
| Thermoplastic resin | Polyester resin | | | | | | | |
| | Silicone resin | | | | | | | |
| | Silicone resin | 40 | | | | | | |
| | Silicone resin | | 40 | | | | | |
| | Polyamide resin | | | 200 | | | | |
| | Acrylic resin | | | | 200 | | | |
| | Acrylic resin | | | | | 200 | | |
| | Acrylic resin | | | | | | 200 | |
| | Acrylic resin | | | | | | | 200 |
| Curing agent | Phenolic curing agent | 33 | 33 | 38 | 38 | 38 | 38 | 38 |
| Inorganic filler | Fused silica (av. particle dia.: 8 μm) | 1070 | 1070 | 1050 | 1050 | 1050 | 1050 | 1050 |
| Carbon black | | 5 | 5 | 5 | 5 | 5 | 5 | 5 |
| Coupling agent | | 2 | 2 | 2 | 2 | 2 | 2 | 2 |
| Ion catcher | | 5 | 5 | 5 | 5 | 5 | 5 | 5 |
| Curing accelerator | Phosphoric catalyst | 3 | 3 | 3 | 3 | 3 | 3 | 3 |
| | Difference in HSP value | 12 | 12 | 12 | 12 | 12 | 12 | 12 |
| | Filler filling ratio | 85.0% | 85.0% | 74.9% | 74.9% | 74.9% | 74.9% | 74.9% |
| | Stress relaxation property | A | A | A | A | A | A | A |

(In the Table, PEG diglycidyl ether is polyethylene glycol diglycidyl ether.)

TABLE 9

| | Kind | Epoxy equiv. (g/eq) | Hydroxyl equiv. (g/eq) | Num. of epoxy functional group | Reactive functional group | Mw | Form | Tg (° C.) | Melting point (° C.) | Ex. 89 | Ex. 90 |
|---|---|---|---|---|---|---|---|---|---|---|---|
| First epoxy resin | PEG diglycidyl ether (n = 22) | 551 | | 2 | | | Liquid | | | 10 | 10 |
| | PPG-modified diglycidyl ether (n = 4 to 12) | 390 | | 2 | | | Liquid | | | | |
| Second epoxy resin | Biphenyl-type epoxy | 192 | | 2 | | | Solid | | 105 | | |
| | Phenolphthalein-type epoxy | 265 | | 2 | | | Solid | | 85 | 90 | 90 |
| | p-aminophenol-type epoxy | 98 | | 2< | | | Liquid | <0 | | | |
| Thermoplastic resin | Polyester resin | | | | Carboxy | 23,000 | Rubbery | 4 | | 200 | 200 |
| | Acrylic resin | | | | Epoxy | 200,000 | Rubbery | −30 | | | |
| | Silicone resin | | | | Epoxy | 7,100 | Liquid | | | | |
| Curing agent | Phenolic curing agent | | 105 | | | | Solid | | 80 | 38 | |
| | Phenolic curing agent | | 104 | | | | Solid | | 100 | | 37 |
| | Phenolic curing agent | | 104 | | | | Solid | | 60 | | |
| Inorganic filler | Fused silica (av. particle dia.: 8 μm) | | | | | | | | | 1050 | 1050 |
| Carbon black | | | | | | | | | | 5 | 5 |
| Coupling agent | | | | | | | | | | 2 | 2 |
| Ion catcher | | | | | | | | | | 5 | 5 |
| Curing accelerator | Phosphoric catalyst | | | | | | | | | 3 | 3 |
| Difference in HSP value | | | | | | | | | | 12 | 12 |
| Filler filling ratio | | | | | | | | | | 74.9% | 74.9% |
| Stress relaxation property | | | | | | | | | | A | A |

| | | Ex. | | | | | | | |
|---|---|---|---|---|---|---|---|---|---|
| | Kind | 91 | 92 | 93 | 94 | 95 | 96 | 97 | 98 |
| First epoxy resin | PEG diglycidyl ether (n = 22) | 10 | 13 | 13 | 13 | 15 | 15 | 15 | |
| | PPG-modified diglycidyl ether (n = 4 to 12) | | | | | 15 | 15 | 15 | 30 |
| Second epoxy resin | Biphenyl-type epoxy | | | 37 | | | | | |
| | Phenolphthalein-type epoxy | 90 | 50 | 50 | 50 | 70 | 70 | 70 | 70 |
| | p-aminophenol-type epoxy | | | | 37 | 37 | | | |
| Thermoplastic resin | Polyester resin | 200 | 200 | 200 | 100 | 200 | | | |
| | Acrylic resin | | | | 100 | | 200 | | |
| | Silicone resin | | | | | | | 30 | 30 |
| Curing agent | Phenolic curing agent | | | | | | | | |
| | Phenolic curing agent | | | | | | | | |
| | Phenolic curing agent | 37 | 42 | 61 | 61 | 34 | 34 | 34 | 34 |
| Inorganic filler | Fused silica (av. particle dia.: 8 μm) | 1050 | 1070 | 1120 | 1120 | 1040 | 1040 | 1020 | 1020 |
| Carbon black | | 5 | 5 | 5 | 5 | 5 | 5 | 5 | 5 |
| Coupling agent | | 2 | 2 | 2 | 2 | 2 | 2 | 2 | 2 |
| Ion catcher | | 5 | 5 | 5 | 5 | 5 | 5 | 5 | 5 |
| Curing accelerator | Phosphoric catalyst | 3 | 3 | 3 | 3 | 3 | 3 | 3 | 3 |
| Difference in HSP value | | 12 | 12 | 12 | 12 | 9 | 9 | 9 | 7 |
| Filler filling ratio | | 74.9% | 75.0% | 74.8% | 74.8% | 74.9% | 74.9% | 85.1% | 85.1% |
| Stress relaxation property | | A | A | A | A | A | A | A | B |

(In the Table, PEG diglycidyl ether is polyethylene glycol diglycidyl ether, and PPG-modified diglycidyl ether is polypropylene glycol-modified diglycidyl ether.)

TABLE 10

| | Kind | Epoxy equiv. (g/eq) | Hydroxyl equiv. (g/eq) | Num. of epoxy functional group | Reactive functional group | Mw | Form | Tg (° C.) | Melting point (° C.) | Ex. 99 | Ex. 100 |
|---|---|---|---|---|---|---|---|---|---|---|---|
| First epoxy resin | PPG diglycidyl ether (n = 11) | 471 | | 2 | | | Liquid | | | 10 | 10 |
| | PPG-modified diglycidyl ether (n = 4 to 12) | 390 | | 2 | | | Liquid | | | | |

TABLE 10-continued

| | | | | | | | | |
|---|---|---|---|---|---|---|---|---|
| Second epoxy resin | Biphenyl-type epoxy | 192 | 2 | | Solid | 105 | | |
| | Phenolphthalein-type epoxy | 265 | 2 | | Solid | 85 | 90 | 90 |
| | p-aminophenol-type epoxy | 98 | 2< | | Liquid | <0 | | |
| Thermoplastic resin | Polyester resin | | | Carboxy | 23,000 | Rubbery | 4 | 200 | 200 |
| | Acrylic resin | | | Epoxy | 200,000 | Rubbery | −30 | | |
| | Silicone resin | | | Epoxy | 7,100 | Liquid | | | |
| Curing agent | Phenolic curing agent | 105 | | | Solid | 80 | 38 | |
| | Phenolic curing agent | 104 | | | Solid | 100 | | 37 |
| | Phenolic curing agent | 104 | | | Solid | 60 | | |
| Inorganic filler | Fused silica (av. particle dia.: 8 μm) | | | | | | 1050 | 1050 |
| Carbon black | | | | | | | 5 | 5 |
| Coupling agent | | | | | | | 2 | 2 |
| Ion catcher | | | | | | | 5 | 5 |
| Curing accelerator | Phosphoric catalyst | | | | | | 3 | 3 |
| | Difference in HSP value | | | | | | 11 | 11 |
| | Filler filling ratio | | | | | | 74.9% | 74.9% |
| | Stress relaxation property | | | | | | A | A |

| | | Ex. | | | | | | |
|---|---|---|---|---|---|---|---|---|
| | Kind | 101 | 102 | 103 | 104 | 105 | 106 | 107 |
| First epoxy resin | PPG diglycidyl ether (n = 11) | 10 | 13 | 13 | 13 | 15 | 15 | 15 |
| | PPG-modified diglycidyl ether (n = 4 to 12) | | | | | 15 | 15 | 15 |
| Second epoxy resin | Biphenyl-type epoxy | | 37 | | | | | |
| | Phenolphthalein-type epoxy | 90 | 50 | 50 | 50 | 70 | 70 | 70 |
| | p-aminophenol-type epoxy | | | 37 | 37 | | | |
| Thermoplastic resin | Polyester resin | 200 | 200 | 200 | 100 | 200 | | |
| | Acrylic resin | | | | 100 | | 200 | |
| | Silicone resin | | | | | | | 30 |
| Curing agent | Phenolic curing agent | | | | | | | |
| | Phenolic curing agent | | | | | | | |
| | Phenolic curing agent | 37 | 42 | 61 | 61 | 34 | 34 | 34 |
| Inorganic filler | Fused silica (av. particle dia.: 8 μm) | 1050 | 1070 | 1120 | 1120 | 1040 | 1040 | 1020 |
| Carbon black | | 5 | 5 | 5 | 5 | 5 | 5 | 5 |
| Coupling agent | | 2 | 2 | 2 | 2 | 2 | 2 | 2 |
| Ion catcher | | 5 | 5 | 5 | 5 | 5 | 5 | 5 |
| Curing accelerator | Phosphoric catalyst | 3 | 3 | 3 | 3 | 3 | 3 | 3 |
| Difference in HSP value | | 11 | 8 | 8 | 8 | 8 | 8 | 8 |
| Filler filling ratio | | 74.9% | 75.0% | 74.8% | 74.8% | 74.9% | 74.9% | 85.1% |
| Stress relaxation property | | A | B | B | B | B | B | B |

(In the Table, PPG diglycidyl ether is polypropylene glycol diglycidyl ether, and PPG-modified diglycidyl ether is polypropylene glycol-modified diglycidyl ether.)

TABLE 11

| | | Epoxy equiv. (g/eq) | Hydroxyl equiv. (g/eq) | Num. of epoxy functional group | Reactive functional group | Mw | Form | Tg (° C.) | Melting point (° C.) | Ex. | |
|---|---|---|---|---|---|---|---|---|---|---|---|
| | Kind | | | | | | | | | 108 | 109 |
| First epoxy resin | PBG diglycidyl ether (n = 8 to 9) | 450 | | 2 | | | Liquid | | 10 | 10 | |
| | PPG-modified diglycidyl ether (n = 4 to 12) | 390 | | 2 | | | Liquid | | | | 10 |
| Second epoxy resin | Biphenyl-type epoxy | 192 | | 2 | | | Solid | | 105 | | |
| | Phenolphthalein-type epoxy | 265 | | 2 | | | Solid | | 85 | 90 | 90 |
| | p-aminophenol-type epoxy | 98 | | 2< | | | Liquid | | <0 | | |
| Thermoplastic resin | Polyester resin | | | | Carboxy | 23,000 | Rubbery | 4 | | 200 | 200 |
| | Acrylic resin | | | | Epoxy | 200,000 | Rubbery | −30 | | | |
| | Silicone resin | | | | Epoxy | 7,100 | Liquid | | | | |
| Curing agent | Phenolic curing agent | | 105 | | | | Solid | | 80 | 38 | |
| | Phenolic curing agent | | 104 | | | | Solid | | 100 | | 37 |
| | Phenolic curing agent | | 104 | | | | Solid | | 60 | | |
| Inorganic filler | Fused silica (av. particle dia.: 8 μm) | | | | | | | | | 1050 | 1050 |

TABLE 11-continued

|  |  |  |  |  |  |  |  |  |
|---|---|---|---|---|---|---|---|---|
| Carbon black |  |  |  |  |  |  | 5 | 5 |
| Coupling agent |  |  |  |  |  |  | 2 | 2 |
| Ion catcher |  |  |  |  |  |  | 5 | 5 |
| Curing accelerator | Phosphoric catalyst |  |  |  |  |  | 3 | 3 |
|  |  | Difference in HSP value |  |  |  |  | 10 | 10 |
|  |  | Filler filling ratio |  |  |  |  | 74.9% | 74.9% |
|  |  | Stress relaxation property |  |  |  |  | A | A |

|  |  |  | Ex. |  |  |  |  |  |  |
|---|---|---|---|---|---|---|---|---|---|
|  |  | Kind | 110 | 111 | 112 | 113 | 114 | 115 | 116 |
| First epoxy resin |  | PBG diglycidyl ether (n = 8 to 9) | 10 | 13 | 13 | 13 | 15 | 15 | 15 |
|  |  | PPG-modified diglycidyl ether (n = 4 to 12) |  |  |  |  | 15 | 15 | 15 |
| Second epoxy resin |  | Biphenyl-type epoxy |  | 37 |  |  |  |  |  |
|  |  | Phenolphthalein-type epoxy | 90 | 50 | 50 | 50 | 70 | 70 | 70 |
|  |  | p-aminophenol-type epoxy |  |  | 37 | 37 |  |  |  |
| Thermo-plastic resin |  | Polyester resin | 200 | 200 | 200 | 100 | 200 |  |  |
|  |  | Acrylic resin |  |  |  | 100 |  | 200 |  |
|  |  | Silicone resin |  |  |  |  |  |  | 30 |
| Curing agent |  | Phenolic curing agent |  |  |  |  |  |  |  |
|  |  | Phenolic curing agent |  |  |  |  |  |  |  |
|  |  | Phenolic curing agent | 37 | 42 | 61 | 61 | 34 | 34 | 34 |
| Inorganic filler |  | Fused silica (av. particle dia.: 8 μm) | 1050 | 1070 | 1120 | 1120 | 1040 | 1040 | 1020 |
| Carbon black |  |  | 5 | 5 | 5 | 5 | 5 | 5 | 5 |
| Coupling agent |  |  | 2 | 2 | 2 | 2 | 2 | 2 | 2 |
| Ion catcher |  |  | 5 | 5 | 5 | 5 | 5 | 5 | 5 |
| Curing accelerator |  | Phosphoric catalyst | 3 | 3 | 3 | 3 | 3 | 3 | 3 |
|  |  | Difference in HSP value | 10 | 7 | 8 | 8 | 8 | 8 | 8 |
|  |  | Filler filling ratio | 74.9% | 75.0% | 74.8% | 74.8% | 74.9% | 74.9% | 85.1% |
|  |  | Stress relaxation property | A | C | B | B | B | B | B |

(In the Table, PBG diglycidyl ether is polybutylene glycol diglycidyl ether, and PPG-modified diglycidyl ether is polypropylene glycol-modified diglycidyl ether.)

TABLE 12

|  |  | Epoxy equiv. (g/eq) | Hydroxyl equiv. (g/eq) | Num. of epoxy functional group | Reactive functional group | Mw | Form | Melting point (° C.) | Ex. |  |  |  |
|---|---|---|---|---|---|---|---|---|---|---|---|---|
|  | Kind |  |  |  |  |  |  |  | 117 | 118 | 119 | 120 |
| First epoxy resin | PEG diglycidyl ether (n = 22) | 551 |  | 2 |  |  | Liquid |  | 10 | 10 | 20 | 20 |
|  | PPG diglycidyl ether (n = 11) | 471 |  | 2 |  |  | Liquid |  |  |  |  |  |
|  | PBG diglycidyl ether (n = 8 to 9) | 471 |  | 2 |  |  | Liquid |  |  |  |  |  |
| Second epoxy resin | Liquid bisphenol A-type epoxy | 189 |  | 2 |  |  | Liquid |  | 80 | 60 |  |  |
|  | Naphthalene-type epoxy | 142 |  | 2 |  |  | Liquid |  |  |  | 80 | 50 |
|  | Alicyclic epoxy | 137 |  | 2 |  |  | Liquid |  |  | 20 |  | 30 |
| Thermoplastic resin | Silicone resin |  |  |  | Epoxy | 7,100 | Liquid |  | 10 | 30 | 15 | 15 |
| Curing agent | Acid anhydride-based curing agent |  | 168 |  |  |  | Liquid |  | 70 | 80 | 100 | 100 |
| Inorganic filler | Fused silica (av. particle dia.: 8 μm) |  |  |  |  |  |  |  | 1030 | 1200 | 1290 | 1290 |

TABLE 12-continued

|  |  |  |  |  |  |
|---|---|---|---|---|---|
| Carbon black |  | 2 | 2 | 2 | 2 |
| Coupling agent |  | 2 | 2 | 2 | 2 |
| Ion catcher |  | 5 | 5 | 5 | 5 |
| Curing accelerator | Phosphoric catalyst | 3 | 3 | 3 | 3 |
| Difference in HSP value |  | 9 | 8 | 9 | 8 |
| Filler filling ratio |  | 85.0% | 85.0% | 85.0% | 85.0% |
| Stress relaxation property |  | C | A | B | A |

|  | Kind | Ex. | | | | | | | |
|---|---|---|---|---|---|---|---|---|---|
|  |  | 121 | 122 | 123 | 124 | 125 | 126 | 127 | 128 |
| First epoxy resin | PEG diglycidyl ether (n = 22) |  |  |  |  |  |  |  |  |
|  | PPG diglycidyl ether (n = 11) | 10 | 10 | 20 | 20 |  |  |  |  |
|  | PBG diglycidyl ether (n = 8 to 9) |  |  |  |  | 10 | 10 | 20 | 20 |
| Second epoxy resin | Liquid bisphenol A-type epoxy | 80 | 60 |  |  | 80 | 60 |  |  |
|  | Naphthalene-type epoxy |  |  | 80 | 50 |  |  | 80 | 50 |
|  | Alicyclic epoxy |  | 20 |  | 30 |  | 20 |  | 30 |
| Thermoplastic resin | Silicone resin | 10 | 30 | 15 | 15 | 10 | 30 | 15 | 15 |
| Curing agent | Acid anhydride-based curing agent | 70 | 80 | 100 | 100 | 70 | 80 | 100 | 100 |
| Inorganic filler | Fused silica (av. particle dia.: 8 μm) | 1030 | 1200 | 1290 | 1290 | 1030 | 1200 | 1290 | 1290 |
| Carbon black |  | 2 | 2 | 2 | 2 | 2 | 2 | 2 | 2 |
| Coupling agent |  | 2 | 2 | 2 | 2 | 2 | 2 | 2 | 2 |
| Ion catcher |  | 5 | 5 | 5 | 5 | 5 | 5 | 5 | 5 |
| Curing accelerator | Phosphoric catalyst | 3 | 3 | 3 | 3 | 3 | 3 | 3 | 3 |
| Difference in HSP value |  | 7 | 7 | 7 | 7 | 8 | 8 | 8 | 7 |
| Filler filling ratio |  | 85.0% | 85.0% | 85.0% | 85.0% | 85.0% | 85.0% | 85.0% | 85.0% |
| Stress relaxation property |  | C | A | B | A | C | A | B | A |

(In the Table, PEG diglycidyl ether is polyethylene glycol diglycidyl ether, PPG diglycidyl ether is polypropylene glycol diglycidyl ether, and PBG diglycidyl ether is polybutylene glycol diglycidyl ether.)

As compared to the results of Comparative Examples and Reference Example, in Examples, the warpage after the lapse of 24 hours was reduced to 50% or less, 40% or less, or 20% or less, and the stress relaxation property was excellent. Such an effect was obtained with different kinds of the first epoxy resins, the second epoxy resins, the thermoplastic resins, or the curing agents.

Although the present invention has been described in terms of the presently preferred embodiments, it is to be understood that such disclosure is not to be interpreted as limiting. Various alterations and modifications will no doubt become apparent to those skilled in the art to which the present invention pertains, after having read the above disclosure. Accordingly, it is intended that the appended claims be interpreted as covering all alterations and modifications as fall within the true spirit and scope of the invention.

INDUSTRIAL APPLICABILITY

According to the curable resin composition or the curable sheet according to the above aspects of the present invention, even when laminated with an adherend, such as a substrate, and cured, warpage of the laminate can be relaxed, while the strength of the cured product layer is ensured. The curable resin composition and the curable sheet are therefore useful as a sealing material for sealing a mounting structure including a substrate and the like, electronic components, and the like. Furthermore, the curable resin composition and the curable sheet are also suited to use as a sealing material for a fan-out wafer level package (FOWLP) and a fan-out panel level package (FOPLP).

REFERENCE SIGNS LIST

10: mounting member
1: first circuit member
2: second circuit member
3: bump
4: cured product of curable sheet
4P: curable sheet
5: underfill material
6: pressing member

The invention claimed is:

1. A curable resin composition, comprising:
   a first epoxy resin having a polyoxyalkylene chain;
   a second epoxy resin different from the first epoxy resin;
   a thermoplastic resin having a weight average molecular weight of 300,000 or less, and having a reactive functional group;
   at least one selected from the group consisting of a curing agent and a curing accelerator; and
   an inorganic filler.

2. The curable resin composition according to claim 1, wherein an alkylene group contained in the polyoxyalkylene chain has two or more carbon atoms.

3. The curable resin composition according to claim 1, wherein the number of repeating oxyalkylene units in the polyoxyalkylene chain is three or more.

4. The curable resin composition according to claim 1, wherein the first epoxy resin includes a polyalkylene glycol glycidyl ether.

5. The curable resin composition according to claim 1, wherein the first epoxy resin includes at least one selected from the group consisting of a glycidyl ether of an alkylene oxide adduct of an aromatic polyol and a glycidyl ether of an alkylene oxide adduct of an alicyclic polyol.

6. The curable resin composition according to claim 1, wherein the second epoxy resin includes an epoxy resin having at least one ring structure selected from the group consisting of an aromatic ring and a five- or more-membered heterocyclic ring, or a hydrogenated product of the epoxy resin.

7. The curable resin composition according to claim 1, wherein a Hansen solubility parameter value of the first epoxy resin and a Hansen solubility parameter value of the second epoxy resin differ by 6 or more.

8. The curable resin composition according to claim 1, wherein the thermoplastic resin includes an acrylic thermoplastic resin.

9. The curable resin composition according to claim 1, wherein the thermoplastic resin includes a silicone-based thermoplastic resin.

10. The curable resin composition according to claim 1, wherein the thermoplastic resin has, as the reactive functional group, at least an epoxy group.

11. The curable resin composition according to claim 1, wherein the thermoplastic resin has a weight average molecular weight of 5,000 or more and 200,000 or less.

12. The curable resin composition according to claim 1, wherein the thermoplastic resin is contained in an amount of 10 parts by mass or more and 400 parts by mass or less, per 100 parts by mass of a total of the first epoxy resin and the second epoxy resin.

13. The curable resin composition according to claim 12, wherein the thermoplastic resin is contained in an amount of 50 parts by mass or more and 400 parts by mass or less.

14. The curable resin composition according to claim 1, wherein the first epoxy resin and the second epoxy resin are contained in a mass ratio of 5:95 to 50:50.

15. The curable resin composition according to claim 1, wherein
in a laminate obtained by forming a cured product layer of the curable resin composition in a thickness of 200 μm on one principal surface of a disc-shaped substrate of 300 mm in diameter and 200 μm in thickness,
a warpage of the laminate after 24 hours from the formation of the cured product layer is 40% or less of a warpage of the laminate immediately after the formation of the cured product layer.

16. The curable resin composition according to claim 1, wherein
the curable resin composition contains the curing agent,
the curing agent has a functional group that reacts with an epoxy group, and
the number of equivalents of the functional group is 0.1 to 1.5 equivalents per one equivalent of the epoxy group.

17. The curable resin composition according to claim 16, wherein the curable resin composition further contains the curing accelerator.

18. The curable resin composition according to claim 1, wherein the curable resin composition is liquid.

19. A curable sheet formed from the curable resin composition according to claim 1.

20. The curable sheet according to claim 19, for use to seal a mounting member including a circuit member.

21. The curable resin composition according to claim 6, wherein a sum of a proportion of the first epoxy resin and a proportion of the epoxy resin having at least one ring structure or the hydrogenated product of the epoxy resin in the whole epoxy resin contained in the curable resin composition is 90 mass % or more.

* * * * *